US009691999B2

(12) United States Patent
Hamano

(10) Patent No.: US 9,691,999 B2
(45) Date of Patent: Jun. 27, 2017

(54) PHOTOELECTRIC CONVERSION DEVICE VAPOR DEPOSITION MATERIAL, PHOTOELECTRIC CONVERSION DEVICE, SENSOR, AND IMAGING DEVICE

(71) Applicant: FUJIFILM CORPORATION, Tokyo (JP)

(72) Inventor: Mitsumasa Hamano, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 531 days.

(21) Appl. No.: 14/163,975

(22) Filed: Jan. 24, 2014

(65) Prior Publication Data

US 2014/0138522 A1    May 22, 2014

Related U.S. Application Data

(63) Continuation of application No. PCT/JP2012/069281, filed on Jul. 24, 2012.

(30) Foreign Application Priority Data

Jul. 25, 2011  (JP) .................................. 2011-162003

(51) Int. Cl.
*H01L 51/44*   (2006.01)
*C23C 14/26*   (2006.01)
(Continued)

(52) U.S. Cl.
CPC .......... *H01L 51/44* (2013.01); *C01B 31/0213* (2013.01); *C23C 14/26* (2013.01);
(Continued)

(58) Field of Classification Search
CPC . C01B 31/0213; H01L 27/307; H01L 51/002; H01L 51/44; H01L 27/03;
(Continued)

(56) References Cited

U.S. PATENT DOCUMENTS 4,786,538 A * 11/1988 Saito ...................... G11B 7/243
                                                          346/135.1
5,286,587 A *  2/1994 Ashiya .................. G03G 5/047
                                                          427/74
(Continued)

FOREIGN PATENT DOCUMENTS

EP          2259359 A2   12/2010
JP      2000-297068 A   10/2000
(Continued)

OTHER PUBLICATIONS

An Office Action; "First Notification of Grounds for Rejection," issued by the Korean Patent Office on Oct. 19, 2015, which corresponds to Korean Patent Application No. 2014-7004755; with English language partial translation.
(Continued)

*Primary Examiner* — Georgia Y Epps
*Assistant Examiner* — Don Williams
(74) *Attorney, Agent, or Firm* — Studebaker & Brackett PC

(57) ABSTRACT

In the photoelectric conversion device having a pair of electrodes and a light receiving layer sandwiched between the pair of electrodes and including at least a photoelectric conversion layer, at least a part of the light receiving layer includes a fullerene or a fullerene derivative deposited using a vapor deposition material of a plurality of particles or a compact formed of the particles consisting primarily of the fullerene or fullerene derivative with an average particle size expressed as D50% of 50 to 300 μm.

13 Claims, 4 Drawing Sheets

(51) Int. Cl.
  *H01L 51/00*  (2006.01)
  *C01B 31/02*  (2006.01)
  *H01L 51/42*  (2006.01)
  *H01L 27/30*  (2006.01)

(52) U.S. Cl.
  CPC ........ *H01L 51/001* (2013.01); *H01L 51/0002* (2013.01); *H01L 27/307* (2013.01); *H01L 51/4246* (2013.01); *H01L 51/4273* (2013.01)

(58) Field of Classification Search
  CPC .............. H01L 51/001; H01L 51/4246; H01L 51/4273; H01L 51/0002; C23C 14/26
  USPC ..... 250/208.1, 214.1; 257/40; 136/256, 263; 438/57, 82
  See application file for complete search history.

(56) References Cited

U.S. PATENT DOCUMENTS

| | | | |
|---|---|---|---|
| 7,863,605 B2 | 1/2011 | Hayashi | |
| 8,513,651 B2 | 8/2013 | Mitsui et al. | |
| 2004/0213727 A1* | 10/2004 | Mauro | B01J 19/088 423/447.1 |
| 2006/0090689 A1* | 5/2006 | Yoshii | B82Y 30/00 117/2 |
| 2008/0035965 A1 | 2/2008 | Hayashi et al. | |
| 2010/0308372 A1 | 12/2010 | Mitsui et al. | |
| 2011/0063485 A1 | 3/2011 | Nomura et al. | |
| 2011/0175031 A1 | 7/2011 | Matsunami et al. | |
| 2012/0111411 A1* | 5/2012 | Uetani | B82Y 10/00 136/263 |
| 2012/0135239 A1 | 5/2012 | Hayashi | |
| 2013/0015435 A1* | 1/2013 | Sawaki | B82Y 10/00 257/40 |
| 2013/0020566 A1 | 1/2013 | Suzuki | |

FOREIGN PATENT DOCUMENTS

| | | |
|---|---|---|
| JP | 2007-123707 A | 5/2007 |
| JP | 2007-277054 A | 10/2007 |
| JP | 2008-072090 A | 3/2008 |
| JP | 2008-291330 A | 12/2008 |
| JP | 4213832 B2 | 1/2009 |
| JP | 2009-049278 A | 3/2009 |
| JP | 2010-278155 A | 12/2010 |
| JP | 2011-014893 A | 1/2011 |
| JP | 2011-091025 A | 5/2011 |
| JP | 2011-228623 A | 11/2011 |
| JP | 2011-236109 A | 11/2011 |
| KR | 2010-0131390 A | 12/2010 |
| KR | 2011-0028234 A | 3/2011 |

OTHER PUBLICATIONS

International Search Report; PCT/JP2012/069281; Oct. 9, 2012.
Written Opinion of the International Searching Authority; PCT/JP2012/069281; Oct. 9, 2012.
An Office Action "Notice of Final Rejection," issued by the Korean Patent Office on Apr. 27, 2016, which corresponds to Korean Patent Application No. 10-2014-7004755 and is related to U.S. Appl. No. 14/163,975; with English language translation.

* cited by examiner

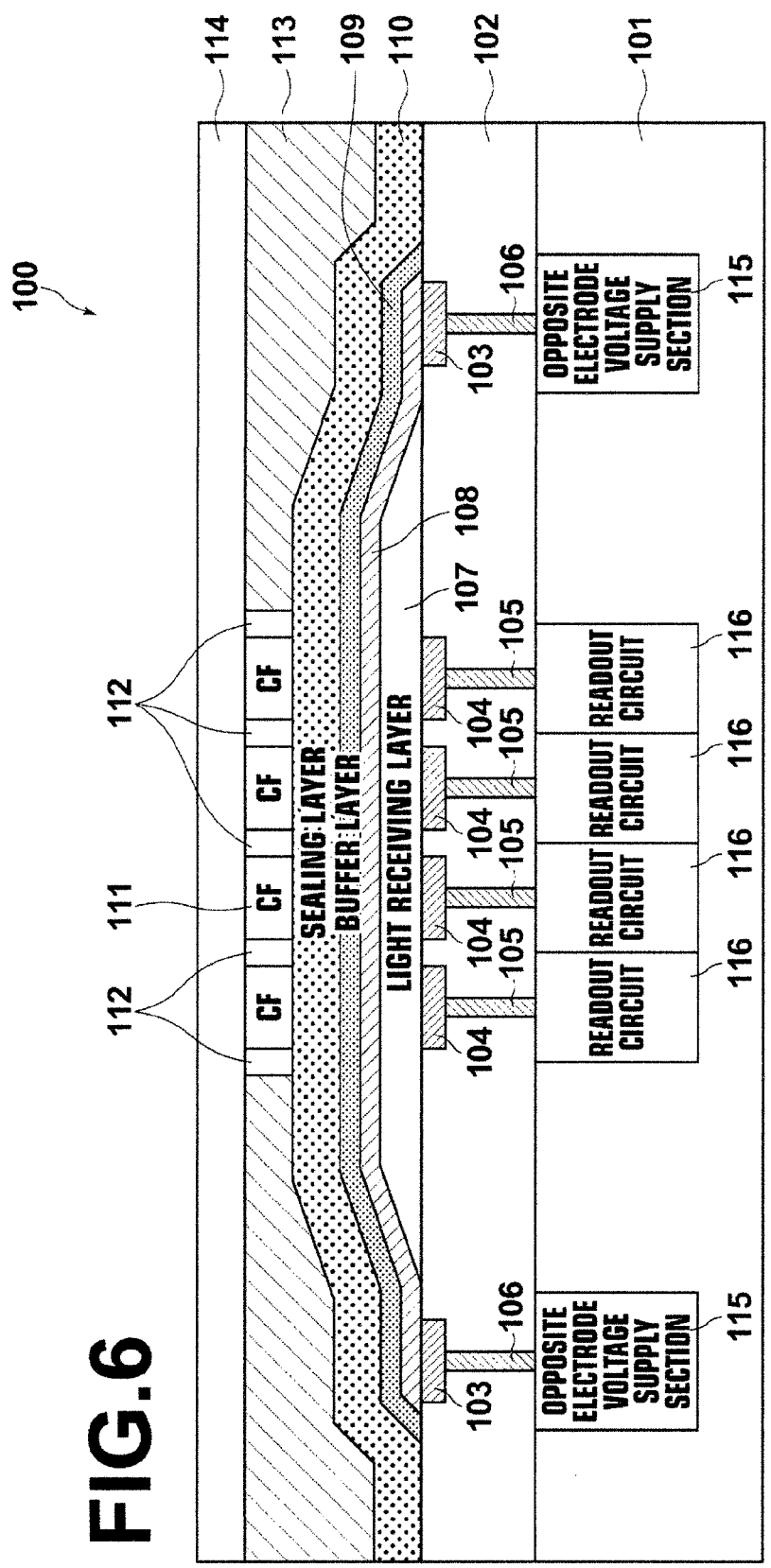

US 9,691,999 B2

PHOTOELECTRIC CONVERSION DEVICE VAPOR DEPOSITION MATERIAL, PHOTOELECTRIC CONVERSION DEVICE, SENSOR, AND IMAGING DEVICE

TECHNICAL FIELD

The present invention relates to an organic photoelectric conversion device vapor deposition material, a photoelectric conversion device obtained by the use of the same, a sensor, and an imaging device.

BACKGROUND ART

As image sensors used for digital still cameras, digital video cameras, cell phone cameras, endoscope cameras, and the like, imaging devices, such as CCD sensors and CMOS sensors, have become widely known. These devices include a photoelectric conversion device having a pair of electrodes and a light receiving layer sandwiched between the electrodes and including a photoelectric conversion layer.

In order to improve photoelectric conversion efficiency of an organic photoelectric conversion device having such light receiving layer, the present applicant has proposed, in Japanese Unexamined Patent Publication No. 2007-123707 (Patent Document 1), an organic photoelectric conversion device that employs a mixed layer of a p-type organic semiconductor and a fullerene or a fullerene derivative (co-deposition layer of two materials) as a part of the light receiving layer.

According to Patent Document 1, a photoelectric conversion device having high photoelectric conversion efficiency with a favorable S/N ratio of photocurrent/dark current may be provided. Photoelectric conversion devices for use in sensors, imaging devices, and the like, however, the response speed is one of the important properties, as well as the photoelectric conversion efficiency and S/N ratio. It is, therefore, more desirable that the photoelectric conversion device described in Patent Document 1 is improved in the response speed.

Although the relationship between the response speed and film property is still unclear, the response speed may possibly be improved by improving unevenness in film quality arising from the difficulty in physical vapor deposition of organic thin films and control of the composition. Generally, in the physical vapor deposition of organic thin film, the organic material is likely to evaporate from near the wall of the heating boat that contains the evaporation source as organic substances have low thermal conductivities and the deposition rate is likely to vary due to bumping and collapse of the material within the boat, causing difficulty in stable evaporation. Thus, it is difficult to form photoelectric conversion layers having favorable properties for organic photoelectric conversion devices by physical vapor deposition at a high yield rate.

Japanese Unexamined Patent Publication No. 2011-091025 (Patent Document 2) discloses a vapor deposition material for flash deposition that allows formation of an organic photoelectric conversion layer at a stable deposition rate by optimizing the average particle size of particles used and homogeneity thereof. It is described that an organic EL device having a photoelectric conversion layer formed of such a vapor deposition material may prevent the initial drop in which luminance degradation occurs exponentially with time.

As a vapor deposition material suitable for forming a photoelectric conversion layer appropriate for an organic EL device by flash deposition, U.S. Patent Application Publication No. 20110175031 (Patent Document 3) discloses a particle formed of a host material of the photoelectric conversion layer and a dopant material strongly bonded together. According to such vapor deposition material, the compounding ratio of host material and dopant material is substantially constant so that a variation in composition that may occur at the time of supplying the materials may be prevented and a luminous layer having high in-plane luminance homogeneity may be formed.

DISCLOSURE OF INVENTION

Patent Document 2 and Patent Document 3 are intended to improve the performance of organic EL devices and the response speed is not discussed at all.

The present invention has been developed in view of the circumstances described above, and it is an object of the present invention to provide a photoelectric conversion device having high photoelectric conversion efficiency with a favorable S/N ratio of photocurrent/dark current and a high response speed, and a sensor and an imaging device having the photoelectric conversion device. It is a further object of the present invention to provide a vapor deposition material for photoelectric conversion device that allows formation of the light receiving layer capable of realizing the photoelectric conversion device regardless of the vapor deposition method used.

A photoelectric conversion device vapor deposition material of the present invention is a material used for depositing a light receiving layer of an organic photoelectric conversion device, the material comprising a plurality of particles or a compact formed of the particles consisting primarily of a fullerene or a fullerene derivative, wherein the plurality of particles has an average particle size expressed as D50% of 50 to 300 μm and a HPLC purity of not less than 99.5%.

The term "consisting primarily of a fullerene or a fullerene derivative" as used herein refers to that a component whose content accounts for not less than 80% of the plurality of particles is the fullerene or fullerene derivative.

The term "average particle size expressed as D50%" as used herein refers to, when a plurality of particles is divided into a larger particle size group and a smaller particle size group with respect to a certain particle size, the particle size at which the larger particle size group and smaller particle size group become an equal amount. In the present invention, the average particle size expressed as D50% is determined by reading a value of 50% of percentage passing or cumulative percentage from a grading curve. There is not any specific restriction on the method of creating the grading curve and, for example, a method in which sample particles are sieved to check as to what weight percent of the sample particles has passed a sieve of which aperture size (in micrometer) and the aperture size is plotted on the horizontal axis while the percentage passing is plotted on the vertical axis or a method that performs a cumulative distribution measurement using a laser diffraction particle size analyzer may be used.

Preferably, a content of each metal element in the particles is less than 100 ppm.

Preferably, the particles consist primarily of a fullerene and more preferably a fullerene C60.

A photoelectric conversion device of the present invention is a device having a pair of electrodes and a light receiving layer sandwiched between the pair of electrodes and including at least a photoelectric conversion layer, wherein at least apart of the light receiving layer includes a fullerene or a fullerene derivative deposited using the vapor deposition material of the present invention described above.

Preferably, in the photoelectric conversion device of the present invention, the layer that includes a fullerene or a fullerene derivative is a layer deposited by a resistance heating vacuum deposition method. Further, the layer that includes a fullerene or a fullerene derivative may be a layer deposited by co-deposition.

An imaging device of the present invention is a device including:

the photoelectric conversion device of the present invention described above, the device being provided in plurality; and a circuit substrate having a signal readout circuit formed therein for reading out a signal according to an amount of charges generated in the photoelectric conversion layer of each photoelectric conversion device.

A sensor of the present invention is a sensor that includes the photoelectric conversion device of the present invention described above.

A method of manufacturing a photoelectric conversion device of the present invention is a method of manufacturing an organic photoelectric conversion device having a pair of electrodes and a light receiving layer sandwiched between the pair of electrodes and including at least a photoelectric conversion layer, the method including the step of forming at least apart of the light receiving layer by a deposition method using the vapor deposition material of the present invention.

As for the deposition method described above, a resistance heating vacuum deposition method is preferable but it may a co-deposition method.

Preferably, a film forming speed of the deposition method is in the range from 0.2 to 12 Å/s.

The deposition temperature of the deposition method may be any temperature as long as it falls within the range of the film forming speed (deposition rate) described above and preferably it falls within a temperature range from 350 to 750° C.

As already described, Patent Document 2 discloses a vapor deposition material for flash deposition that allows formation of an organic photoelectric conversion layer at a stable deposition rate by optimizing the average particle size of particles used and homogeneity thereof. As example vapor deposition materials, Patent Document 2 lists fluorescent materials, host materials, dopant materials, and the like in paragraphs [0018]-[0037]. Further, a fullerene is described in paragraph [0036], as an example dopant material. However, Patent Document 2 does not actually verify the effects of the fullerene.

In the process of conducting studies for increasing the response speed, the present inventor has verified that with respect to fullerenes or fullerene derivatives, stability in the deposition rate is not so influenced by the particle size but the response speed does not necessarily become almost the same even though the stability in the deposition rate is almost the same (refer to Examples described later).

As will be described in detail in the following, the present invention is based on the finding that, for the response speed of a photoelectric conversion device, the behavior of a fullerene or a fullerene derivative constituting a part of the light receiving layer is important, and has found out for the first time that it is possible to increase the response speed of a photoelectric conversion device that uses a mixed layer of a p-type organic semiconductor and a fullerene or a fullerene derivative as a part of the light receiving layer, while maintaining favorable properties (photoelectric conversion efficiency and S/N ratio of photocurrent/dark current), by making the vapor deposition material thereof optimal and suitable. Thus, the present invention is not an invention which could have easily been thought of from Patent Document 2.

In the photoelectric conversion device of the present invention, at least apart of the light receiving layer is deposited using a vapor deposition material of a plurality of particles or a compact formed of the particles consisting primarily of a fullerene or a fullerene derivative, the plurality of particles having an average particle size expressed as D50% of 50 to 300 μm. The film that includes a fullerene or a fullerene derivative deposited using such vapor deposition material is a film formed using a vapor deposition material in which the particle size of the particles containing a fullerene or a fullerene derivative is made optimal and suitable. Consequently, according to the present invention, a photoelectric conversion device having high photoelectric conversion efficiency with a favorable S/N ratio of photocurrent/dark current and a high response speed may be provided.

Further, the embodiment in which the amount of each metal impurity is limited to less than 100 ppm may provide an excellent image quality when applied as the photoelectric conversion device of an imaging device.

BRIEF DESCRIPTION OF DRAWINGS

FIG. 6 is a schematic cross-sectional view of an imaging device according to an embodiment of the present invention, schematically illustrating the structure thereof.

BEST MODE FOR CARRYING OUT THE INVENTION

[Vapor Deposition Material, Photoelectric Conversion Device]

Figure 1:
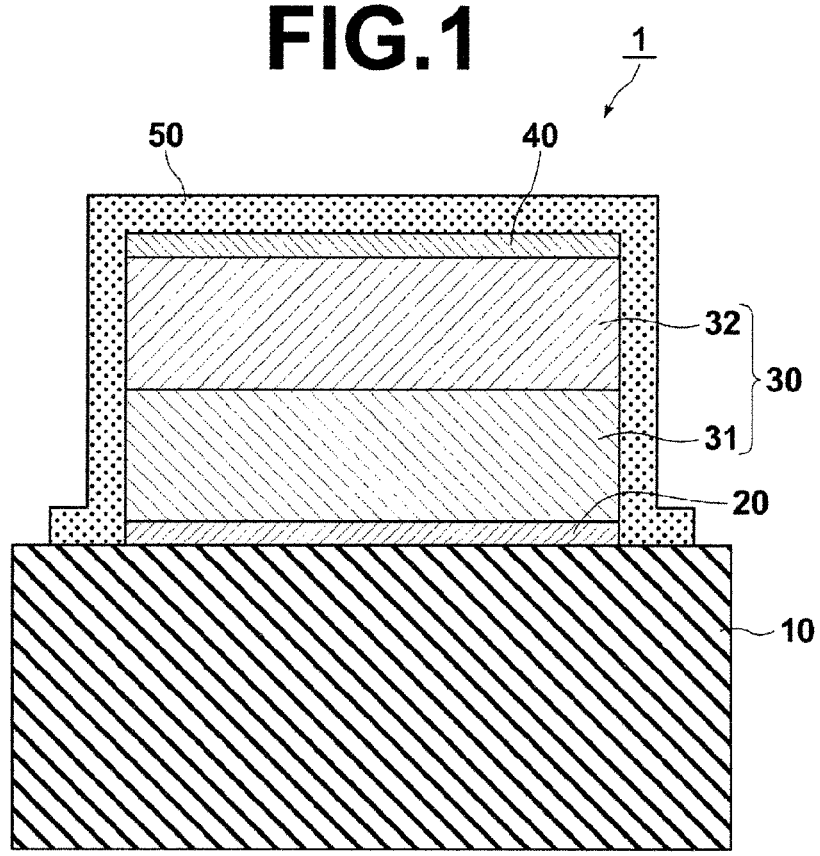
FIG. 1 is a schematic cross-sectional view of an organic photoelectric conversion device according to an embodiment of the present invention, schematically illustrating the structure thereof.

Hereinafter, a photoelectric conversion device according to an embodiment of the present invention will be described with reference to the accompanying drawings. FIG. 1 is a schematic cross-sectional view of the photoelectric conversion device according to the present embodiment, schematically illustrating the structure thereof. Each component in the drawings is not necessarily drawn to scale for ease of visual recognition.

As illustrated in FIG. 1, an organic photoelectric conversion device 1 (photoelectric conversion device 1) includes a substrate 10, a back contact electrode 20 formed on the substrate 10, an electron blocking layer 31 formed on the back contact electrode 20, a photoelectric conversion layer 32 formed on the electron blocking layer 31, an electrode 40 formed on the photoelectric conversion layer 32, and a sealing layer 50 formed on the electrode 40. A light receiving layer 30 is constituted by the electron blocking layer 31 and photoelectric conversion layer 32. The light receiving layer 30 may be any layer as long as it includes at least the photoelectric conversion layer 32 and may include a layer other than the electron blocking layer 31 (e.g., a hole blocking layer).

The electron blocking layer 31 is a layer for preventing the injection of electrons into the photoelectric conversion layer 32 from the back contact electrode 20 and blocking electrons generated in the photoelectric conversion layer 32 from flowing into the electrode 20. The electron blocking layer 31 is formed by including an organic material, inorganic material, or both.

The electrode 40 is an electrode for collecting electrons of charges generated in the photoelectric conversion layer 32. The electrode 40 is made of a conductive material sufficiently transparent to light having a wavelength that can be sensed by the photoelectric conversion layer 32 (e.g., ITO) in order to allow the light to enter into the photoelectric conversion layer 32. Holes and electrons of charges generated in the photoelectric conversion layer 32 may be moved to the electrode 20 and electrode 40 respectively by applying a bias voltage between the electrodes.

The photoelectric conversion device 1 formed in the manner described above is designed to allow light to enter from the side of the upper electrode 40 and when light enters from above the upper electrode 40, the light transmits through the upper electrode 40 and enters into the photoelectric conversion layer 32, thereby charges are generated. Holes of the generated charges are moved to the back contact electrode 20. The holes moved to the back contact electrode 20 are converted to a voltage signal according to the amount thereof and read out, whereby the light can be taken out as a voltage signal.

Alternatively, the bias voltage may be applied such that the electrode 20 collects electrons while the electrode 40 collects holes. In this case, a hole blocking layer is provided instead of the electron blocking layer 31. The hole blocking layer may be an organic layer for preventing the injection of holes into the photoelectric conversion layer 32 from the back contact electrode 20 and blocking holes generated in the photoelectric conversion layer 32 from flowing into the electrode 20. In either case, the portion sandwiched by the electrodes 20 and 40 acts as the light receiving layer 30.

In the photoelectric conversion device 1, at least a part of the light receiving layer 30 includes a fullerene or a fullerene derivative. There is not any specific restriction on the method by which fullerene or fullerene derivative is included in the light receiving layer 30. In the present embodiment, a description will be made of a case in which a mixed layer of a p-type organic semiconductor (p-type organic compound) and a fullerene or fullerene derivative which is an n-type organic semiconductor (hereinafter, referred to as "fullerene mixed layer") is provided as a part of the photoelectric conversion layer 32.

The term "mixed layer" as used herein refers to a layer in which a plurality of materials are mixed or dispersed. In the present embodiment, the mixed layer is a layer formed by co-deposition of a p-type organic semiconductor and a fullerene or fullerene derivative.

Inclusion of the fullerene-mixed layer in the photoelectric conversion layer 32 may compensate for the disadvantage that the photoelectric conversion layer has a short carrier diffusion length, whereby the photoelectric conversion efficiency may be improved. Further, provision of such photoelectric conversion layer 32 may prevent degradation in the device performance even if the photoelectric conversion device 1 in process is exposed to a non-vacuum environment during a period after the formation of the photoelectric conversion layer 32 and before the sealing layer 50 is formed. This may eliminate the need to provide a vacuum conveyance path following the formation of the photoelectric conversion layer 32. Consequently, the production facility of the photoelectric conversion layer 32 may be simplified with reduced production costs.

In the present embodiment, the fullerene mixed layer is a layer formed by co-deposition. The deposition method may include resistance heating vapor deposition, electron beam deposition, flash deposition, and the like. Although there is not any specific restriction on the deposition method as long as it does not significantly undermine the advantages of the present invention, resistance heating vacuum deposition is preferably used.

Figure 2:
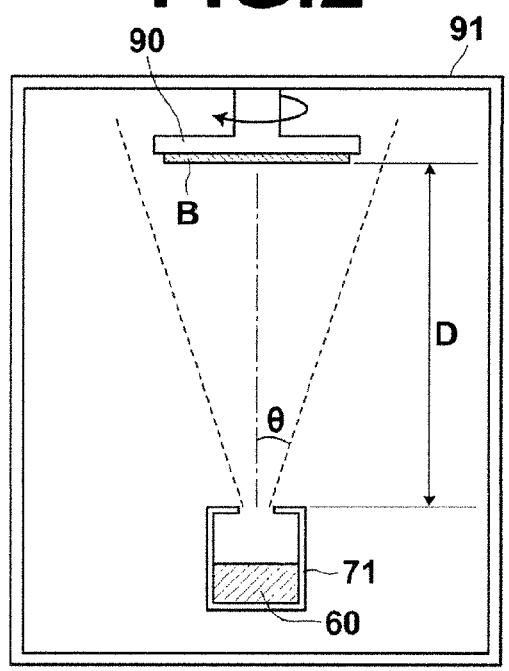
FIG. 2 is a schematic perspective view of a deposition method of a light receiving layer (vacuum deposition).
Figure 3:
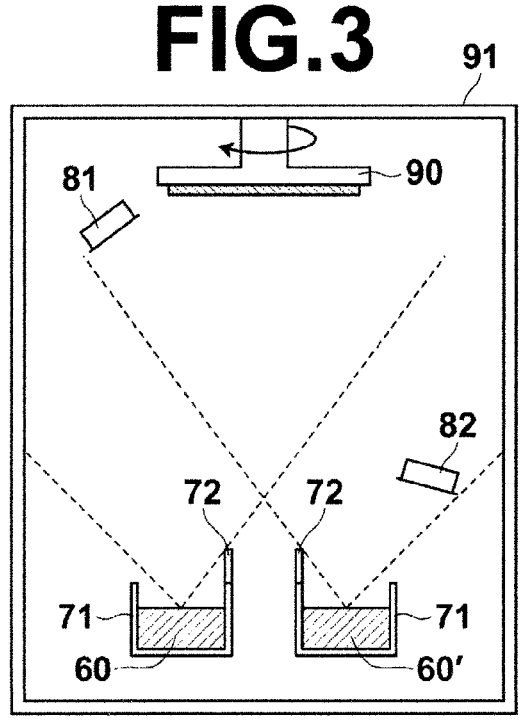
FIG. 3 is a schematic perspective view of a deposition method of a light receiving layer (vacuum co-deposition).

FIGS. 2 and 3 schematically illustrate how film forming is performed in resistance heating vacuum deposition methods, in which FIG. 2 illustrates ordinary deposition and FIG. 3 illustrates co-deposition.

As illustrated in FIG. 2, the deposition of the light receiving layer is normally performed by placing an effusion cell 71 inside of a deposition chamber 91 and mounting a substrate B on a substrate holder 90 of the chamber 91 located above the aperture of the effusion cell 71. A vapor deposition material (raw material) 60 is placed in the effusion cell 71 having a heating function. As the deposition chamber 91 has a high degree of vacuum, the vapor deposition material evaporated from the effusion cell 71 exits from the aperture, travels in a straight line, and is formed on the substrate B. A maximum exit angle $\theta$ of the evaporated vapor deposition material may be controlled by adjusting the diameter of the aperture of the effusion cell 71.

The vapor deposition material 60 is placed as a vapor deposition source having a boat, basket, hairpin, or crucible shape. In the present embodiment, there is not any restriction on the shape of the vapor deposition source.

Preferably, the distance between the effusion cell 71 and substrate B is not less than 10 cm. The evaporated vapor deposition material is incident on the substrate surface by spreading substantially conically with incident angles of 0° to $\theta$ with respect to the substrate surface.

In the case of co-deposition illustrated in FIG. 3, the film forming principle is identical but it is preferable that a wall section 72 or the like erected on a portion of the center side of the upper surface of each effusion cell 71 is provided to reduce the incident angle of the deposition beam at least on the center side of the substrate B in the case of co-deposition. The reference numerals 81 and 82 in FIG. 3 represent film thickness measuring sections (crystal oscillators) for the vapor deposition materials 60 and 60' respectively. The reduction in each deposition angle at the center portion allows a film thickness of each vapor deposition material to be measured and a film forming area of each vapor deposition material on the substrate to be limited.

Figure 4:
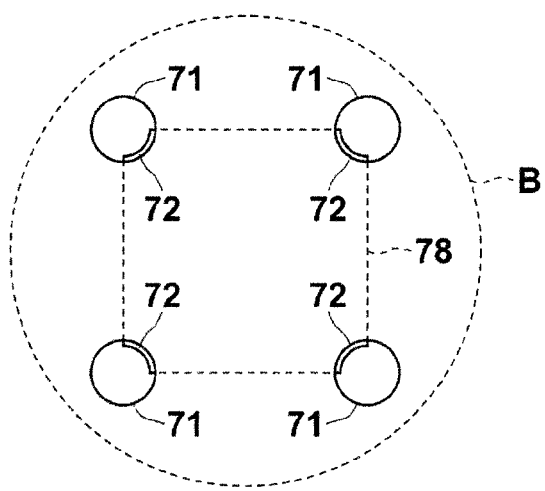
FIG. 4 illustrates an example arrangement of effusion cells in the vacuum deposition (Example 1).
Figure 5:
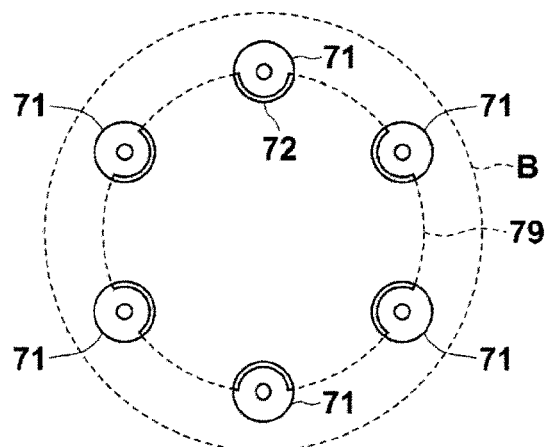
FIG. 5 illustrates an example arrangement of effusion cells in the vacuum deposition (Example 2).

FIGS. 4 and 5 illustrate example arrangements of effusion cells in the case where a plurality of vapor deposition sources is provided (co-deposition). An arrangement method in which effusion cells are disposed, with respect to the disk shaped substrate B, at positions corresponding to the four corners of a square 78 smaller than the substrate B, as illustrated in FIG. 4, and a method in which a plurality of effusion cells is disposed on a circle 79 concentric to and smaller than the disk shaped substrate B, as illustrated in FIG. 5, are preferably used. In the case where effusion cells 71 are disposed at positions corresponding to the four corners of the square 78, as illustrated in FIG. 4, the wall section 72 of each effusion cell 71 may be erected at least only the entire area of the inner side of the square 78. In the case where effusion cells are disposed on the concentric circle 79, as illustrated in FIG. 5, the wall section 72 of each effusion cell 71 may be erected at least only the entire area of the inner side of the concentric circle 79.

Note that the vapor deposition source and deposition source arrangement aspect of the deposition method according to the present invention are not limited to those illustrated in FIGS. 4 and 5.

As described under the "Background Art", it is difficult to maintain stable evaporation in physical vapor deposition of organic films. The present inventor has found out that it is possible to increase the response speed of a photoelectric conversion device that includes a mixed layer of a p-type organic semiconductor and a fullerene or a fullerene derivative while maintaining favorable properties (photoelectric conversion efficiency and S/N ratio of photocurrent/dark current) by using a plurality of particles or a compact formed of the particles consisting primarily of a fullerene or a fullerene derivative with an average particle size expressed as D50% of 50 to 300 μm and a HPLC purity of not less than 99.5% as the vapor deposition material 60 of the fullerene or fullerene derivative used in forming the fullerene-mixed layer (refer to Examples to be described later). Preferably, the film forming speed of the vapor deposition method is in the range from 0.2 to 12 Å/s from the viewpoint of productivity. The deposition temperature of the deposition method may be any temperature as long as it falls within the range of the film forming speed (deposition rate) described above and preferably it falls within a temperature range from 350 to 750° C.

As will be described in Examples, if a plurality of particles consisting primarily of a fullerene or fullerene derivative has an average particle size expressed as D50% of 50 to 300 μm with a HPLC purity of not less than 99.5%, a favorable response speed may be maintained, but if the average particle size fall outside the range, the response speed of a photoelectric conversion device that includes the mixed layer is reduced by not less than 5%, although the stability of deposition rate is not changed so much. The present inventor presumes the reason for the response speed reduction is that a temporal change is likely to occur in the deposition distribution and, as a result, the uniformity of composition in the thickness and in-plane directions of the film is deteriorated.

The deposition distribution is influenced by the evaporation (sublimation) stability of the vapor deposition material. In the case where the average particle size of a plurality of particles consisting primarily of a fullerene or fullerene derivative is large, instantaneous material bumping is likely to occur in the heating process during the deposition, while in the case where the average particle size is too small, the particle size control is likely to be influenced by disturbance due to the size of the surface area and, as a result, it is highly likely that an impurity is mixed, causing difficulty in stable evaporation (sublimation).

In view of mass production in which increased surface areas and prolonged continuous film forming are required, in particular, the adverse impact on the response characteristics due to such deterioration in uniformity of composition is large, as well as significant degradation in yield rate. The present invention is particularly advantageous for increased surface areas and prolonged film forming.

Preferably, the vapor deposition material 60 of the present embodiment does not include metals as impurities. If the contents of metals are large, the influence of metals adhered to the film surface at the time of deposition becomes large, and if it is used in an imaging device, a white spot and a black spot (sensitivity degradation extended over several pixels) are likely to be induced. Preferably, the amount of metals included in the vapor deposition material 60 is less than 250 ppm, more preferably less than 100 ppm, and most preferably less than 10 ppm. Inclusion of each metal listed below in an amount of 100 ppm or greater increases the possibility of white and black spots.

It is particularly preferable that the vapor deposition material 60 does not include among others Al, Fe, Cu, Zn, Zr, Ca, Mg, Cr, Ni, Mo, Mn, Na, Si, B, K, and the like. Further, it is also preferable that the vapor deposition material 60 does not include halogen elements, such as F, Cl, Br, I, and the like. Preferably, the content of halogen elements is less than 100 ppm.

There is not any specific restriction on the method of providing the vapor deposition material 60 of the present embodiment.

If it is a powder of fullerene or fullerene derivative in the particle size range of the vapor deposition material 60, the material may be prepared by sieving the powder step by step using several different meshes. In the case where a large size fullerene or fullerene derivative, a bulk body, or the like is used, the material may be prepared by crushing it by dry jet mill or the like and sieving in a manner identical to that described above. It is preferable that the amounts of metals are not to be increased as far as possible in the preparation method described above.

The obtained powder may be formed into a compact having a specific shape by pressurization, a sintered body obtained by sintering the compact, a granular powder, or a granular sintered body obtained by sintering the granular powder, as required.

Hereinafter, a photoelectric conversion device 1 of FIG. 1 obtained by using the vapor deposition material 60 that includes a plurality of particles consisting primarily of a fullerene or a fullerene derivative of the present embodiment will be described.

<Substrate and Electrodes>

There is not any specific restriction of the substrate 10, and a silicon substrate, a glass substrate, and the like may be used.

The back contact electrode 20 is an electrode for collecting holes of charges generated in the photoelectric conversion layer 32. There is not any specific restriction on the back contact electrode 20 as long as it has a good conductivity. The back contact electrode 20 is made of a transparent material or a non-transparent material that reflects light depending on the application. More specifically, the material of the back contact electrode 20 may include conductive metal oxides, such as antimony- or fluorine-doped tin oxide (ATO, FTO), tin oxide, zinc oxide, indium oxide, indium tin oxide (ITO), indium zinc oxide (IZO), and the like, metals, such as gold, silver, chrome, nickel, titanium, tungsten, aluminum, and the like, conductive compounds, such as oxides and nitrides of these metals (e.g., titanium nitride (TiN)). The material may further include mixtures or layered bodies of these metals and conductive metal oxides, inorganic conductive substances such as copper iodide and copper sulfide, organic conductive materials, such as polyaniline, polythiophene, and the like, and layered bodies of these and ITO or titanium nitride.

The upper electrode 40 is an electrode for collecting electrons of charges generated in the photoelectric conversion layer 32. There is not any specific restriction on the upper electrode 40 as long as it is made of a conductive material sufficiently transparent to light having a wavelength that can be sensed by the photoelectric conversion layer 32 in order to allow the light to enter into the photoelectric conversion layer 32. More specifically, the material of the upper electrode 40 may include conductive metal oxides, such as antimony- or fluorine-doped tin oxide (ATO, FTO), tin oxide, zinc oxide, indium oxide, indium tin oxide (ITO), indium zinc oxide (IZO), and the like, metal films, such as gold, silver, chrome, nickel, and the like, mixtures or layered bodies of these metals and conductive metal oxides, inorganic conductive substances such as copper iodide and copper sulfide, organic conductive materials, such as polyaniline, polythiophene, and the like, and layered bodies of these and ITO. Among them, the conductive metal oxides are preferably used from the view point of high conductivity and transparency.

There is not any specific restriction on the method of forming the electrodes described above, and any method may be selected in view of appropriateness with the electrode material used. More specifically, wet methods, such as printing, coating, and the like, physical methods, such as vacuum deposition, sputtering, ion plating, and chemical methods, such as CVD, plasma CVD, and the like may be used.

In the case where the electrode material is ITO, the electrodes may be formed by electron beam method, sputtering, resistance heating deposition, chemical reaction method (sol-gel method, or the like), or coating of a dispersion of indium tin oxide. The film formed of ITO may further be subjected to UV-ozone treatment or plasma treatment. In the case where the electrode material is TiN, various methods, including reactive sputtering, may be used and UV-ozone treatment or plasma treatment may further be performed.

Preferably, the upper electrode 40 is formed by a plasma-free method as it is formed on the organic photoelectric conversion layer 32 and is preferable to be formed by a method that does not degrade the properties of the organic photoelectric conversion layer 32.

The term "plasma-free" as used herein refers to a state in which no plasma is generated during the formation of the upper electrode 40 or a state in which the distance from the plasma generation source to the substrate is not less than 2 cm, preferably not less than 10 cm, and more preferably not less than 20 cm, whereby the amount of plasma reaching the substrate is reduced.

Example systems that do not generate plasma during formation of the upper electrode 40 may include an electron beam (EB) deposition system and a pulse laser deposition system. As for the EB deposition system and pulse laser deposition system, systems described in "Developments of Transparent Conductive Films" supervised by Yutaka Sawada (published by CMC, 1999), "Developments of Transparent Conductive Films II" supervised by Yutaka Sawada (published by CMC, 2002), "Transparent Conductive Film Technology" by Japan Society for the Promotion of Science (Ohmsha, 1999), and references cited in these books may be used. Hereinafter, a method of forming a transparent electrode film using the EB deposition system is referred to as the "EB deposition method" while a method of forming a transparent electrode film using the pulse laser deposition system is referred to as the "pulse laser deposition method".

As for the system with a distance between the plasma generation source and the substrate not less than 2 cm and may realize a state in which the amount of plasma reaching may be reduced (hereinafter, "plasma-free film forming system"), for example, a facing target sputtering system and an arc plasma deposition process may be cited, and such types of systems are described in "Developments of Transparent Conductive Films" supervised by Yutaka Sawada (published by CMC, 1999), "Developments of Transparent Conductive Films II" supervised by Yutaka Sawada (published by CMC, 2002), "Transparent Conductive Film Technology" by Japan Society for the Promotion of Science (Ohmsha, 1999), and references cited in these books.

In the case where a transparent conductive film, such as TCO, is used as the upper electrode 40, a DC short-circuit or an increased leakage current may sometimes occur. One of the reasons might be that fine cracks formed in the photoelectric conversion layer 32 are covered by the dense film and conductivity with the back contact electrode 20 on the opposite side is increased. Because of this, a leakage current increase is not likely to occur in an electrode film of comparatively poor quality, such as Al or the like. Consequently, the leakage current increase may be inhibited largely by controlling the film thickness of the upper electrode 40 with respect to the film thickness of the photoelectric conversion layer 32 (i.e., depth of cracks). Preferably, the thickness of the upper electrode 40 is ⅕, more preferably 1/10 of that of the photoelectric conversion layer 32.

Generally, if a conductive film is made thinner than a certain limit, the resistance value increases rapidly, but in a solid-state imaging device incorporating the photoelectric conversion device of the present embodiment, the preferable sheet resistance may be 100 to 10000Ω/□, having a large freedom in film thickness for thinning. In addition, as the thickness of the upper electrode 40 is made thinner, a less amount of light is absorbed and, in general, the light transmittance is increased. The increase in the light transmittance is especially preferable because it causes an increase in light absorption in the photoelectric conversion layer 32 and the photoelectric conversion function is improved. In view of the leakage current prevention by thickness reduction, increased resistance value and increased transmittance of thin film, the thickness of the upper electrode 40 is preferable to be in the range from 5 to 100 nm, and more preferable in the range from 5 to 20 nm.

Holes and electrons of charges generated in the photoelectric conversion layer 32 may be moved to the back contact electrode 20 and upper electrode 40 respectively by applying a bias voltage between the electrodes.

<Light Receiving Layer>

The light receiving layer 30 is a layer that includes at least the photoelectric conversion layer 32. In the present embodiment, the light receiving layer 30 includes the electron blocking layer 31 and photoelectric conversion layer 32.

The light receiving layer 30 may be formed by a dry film forming method or a wet film forming method. The dry film forming method is preferable in that it allows uniform film forming with ease, prevents mixing of impurities, allows film thickness control with ease, and allows layering on a different type of material.

Specific dry film forming methods include vacuum deposition, sputtering, ion plating, physical vapor deposition, such as MBE method or the like, and CVD method, such as plasma polymerization. Among them, the vacuum deposition is preferable. In the case where the film forming is performed by the vacuum deposition, manufacturing conditions, such as vacuum degree, deposition temperature, and the like, may be set according to routine procedures. In the case where the light receiving layer 30 is formed by the deposition method, a higher decomposition temperature than the depositable temperature is preferable because it may prevent thermal decomposition at the time of deposition.

In the case where the light receiving layer 30 is formed by the dry film forming method, the vacuum degree at the time of film forming is preferable to be not greater than $1 \times 10^{-3}$ Pa, more preferable to be not greater than $4 \times 10^{-4}$ Pa, and particularly preferable to be not greater than $1 \times 10^{-4}$ Pa in view of preventing device characteristic deterioration at the time when the light receiving layer is formed.

The thickness of the light receiving layer 30 is preferable to be in the range from 10 nm to 1000 nm, more preferable in the range from 50 nm to 800 nm, and particularly preferable in the range from 100 nm to 600 nm. A thickness not less than 10 nm may provide favorable dark current inhibiting effects and a thickness not greater than 1000 nm may provide favorable photoelectric conversion efficiency.

<<Photoelectric Conversion Layer>>

The photoelectric conversion layer 32 is a layer that receives light and generates charges according to the amount of light received and formed by including an organic photoelectric conversion material.

Unlike the luminescent layer (layer that converts an electrical signal to light) of an organic EL, the photoelectric conversion layer 32 is a non-luminescent layer. The term "non-luminescent layer" as used herein refers to a layer with a luminescent quantum efficiency of not greater than 1%, preferably not greater than 0.5%, and more preferably not greater than 0.1% in the visible light range (wavelengths from 400 nm to 730 nm). The photoelectric conversion layer 32 with a luminescent quantum efficiency of greater than 1% is undesirable because, when applied to a sensor or imaging device, the layer may impact on sensing performance or image pickup performance.

In the photoelectric conversion device 1 of the present embodiment, the photoelectric conversion layer 32 includes a mixed layer of a p-type organic semiconductor (p-type organic compound) and a fullerene or a fullerene derivative. As already described, the mixed layer is a layer formed by co-deposition of a p-type organic semiconductor material and a vapor deposition material 60 that includes a plurality of particles consisting primarily of the fullerene or fullerene derivative described above.

In the present invention, the p-type organic semiconductor (compound) may realize favorable device performance without limiting the range of choice for material within an appropriate particle size range that does not impact on the stability of deposition rate. In the present embodiment, the average particle size of the p-type organic semiconductor is preferable in the range from 10 to 800 μm, and more preferably in the range from 20 to 500 μm.

The p-type organic semiconductor (compound) constituting the photoelectric conversion layer 32 is a donor organic semiconductor (compound) represented mainly by hole-transporting organic compounds and has an electron-donating property. More specifically, when two organic materials are used in contact with each other, the p-type organic semiconductor is one of the organic compounds having a smaller ionization potential. Therefore, any donor organic compound may be used as the p-type organic semiconductor as long as it has an electron-donating property.

For example, triarylamine compounds, pyran compounds, quinacridone compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic carbon ring compounds (naphthalene derivatives, anthracene derivatives, phenanthrene derivatives, tethracene derivatives, pyrene derivatives, perylene derivatives, and fluoranthene derivatives), and metal complexes having, as a ligand, a nitrogen-containing hetero cyclic compound may be used. Further, organic compounds that may be used as the donor organic semiconductor are not limited to those described above, and any organic compound may be used as the donor organic semiconductor as long as it has a smaller ionization potential than that of the organic compound used as the n-type organic semiconductor.

Among the compounds described above, triarylamine compounds, pyran compound, quinacridone compounds, pyrrole compounds, phthalocyanine compounds, merocyanine compounds, and condensed aromatic hydrocarbon cyclic compounds are preferable.

As the p-type organic semiconductor, any organic dye may be used, but preferable examples include cyanine dyes, styryl dyes, hemicyanine dyes, merocyanine dyes (including zero methine merocyanines (simple merocyanines)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squalium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugido dyes, perylene dyes, perinone dyes, phenazine dyes, phenothiazine dyes, quinone dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrrolopyrrole dyes, dioxane dyes, porphyrin dyes, chlorophyll dyes, phthalocyanine dyes, metal complex dyes, condensed aromatic hydrocarbon ring system dyes (naphthalene derivatives, anthracene derivatives, phenanthrene derivatives, thetracene derivatives, pyrene derivatives, perylene derivatives, and fluoranthene derivatives). Specific p-type organic semiconductors (compounds) include but not limited to those shown below.

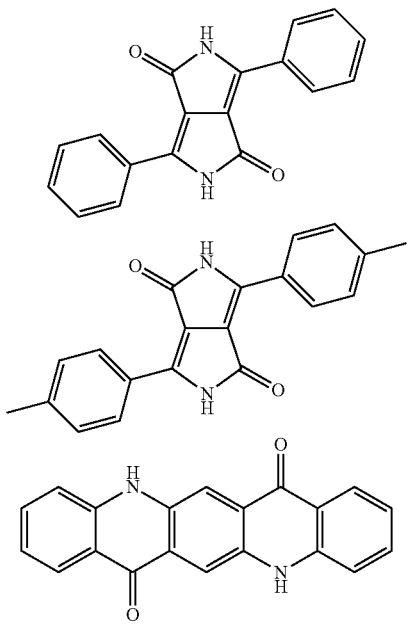

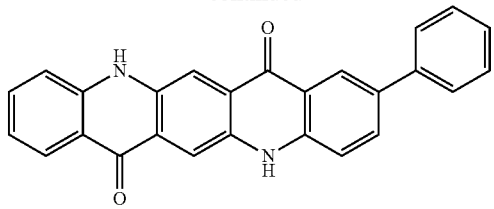

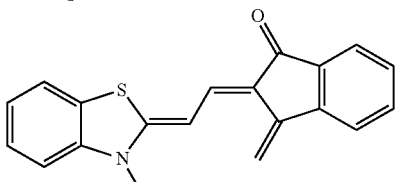

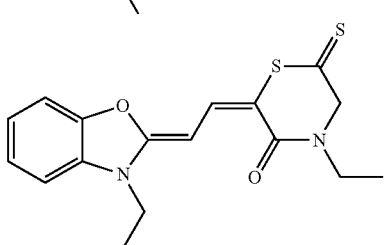

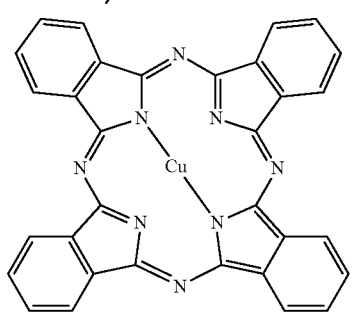

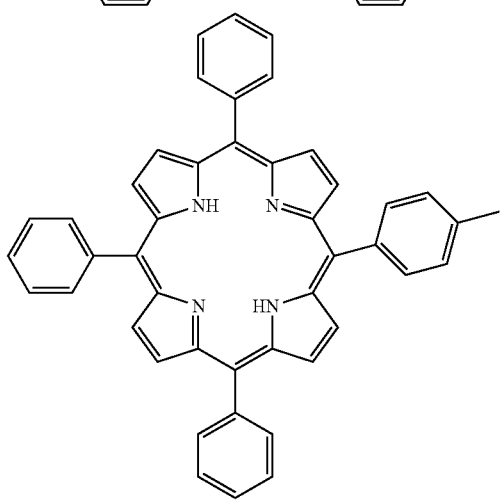

There is not any specific restriction on the fullerene constituting the photoelectric conversion layer 32 and fullerene C60, fullerene C70, fullerene C76, fullerene C78, fullerene C80, fullerene C82, fullerene C84, fullerene C90, fullerene C96, fullerene C240, fullerene C540, mixed fullerene, fullerene nanotube, and the like may be used. A typical skeleton of fullerene is shown below.

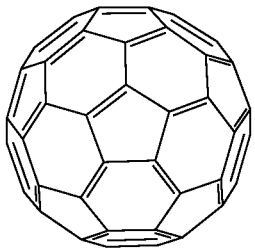 [SMILES: c1cc2c3ccc4c5ccc6c7ccc8c9ccc%10c1c1c2c2c3c4c3c5c6c4c7c8c5c9c%10c1c1c2c3c4c51]

The term "fullerene derivatives" as used herein refers to compounds of these fullerenes having a substituent attached thereto. Preferable substituents of fullerene derivatives are alkyl groups, aryl groups, or heterocyclic groups. Preferable alkyl groups are those with carbon numbers from 1 to 12. Preferable aryl groups and heterocyclic groups are benzene ring, naphthalene ring, anthracene ring, phenanthrene ring, fluorene ring, triphenylene ring, naphthalene ring, biphenyl ring, pyrrole ring, furan ring, thiophene ring, imidazole ring, oxazole ring, thiazole ring, pyridine ring, pyrazine ring, pyrimidine ring, pyridazine ring, indolizine ring, indole ring, benzofuran ring, benzothiophene ring, isobenzofuran ring, benzimidazole ring, imidazopyridine ring, quinolizidine ring, quinoline ring, phthalazine ring, naphthyridine ring, quinoxaline ring, quinoxazoline ring, isoquinoline ring, carbazole ring, phenanthridine ring, acridine ring, phenanthroline ring, thianthrene ring, chromene ring, xanthene ring, phenoxathiin ring, phenothiazine ring, and phenazine ring. Among these, benzene ring, naphthalene ring, anthracene ring, phenanthrene ring, pyridine ring, imidazole ring, oxazole ring, and thiazole ring are more preferable and benzene ring, naphthalene ring, and pyridine ring are particularly preferable. Further, they may have a substituent. Further, they may have a plurality of substituents which may be identical or different. Still further, the plurality of substituents may be linked as far as possible to form a ring.

Inclusion of a fullerene or fullerene derivative in the photoelectric conversion layer 32 allows charges generated by photoelectric conversion to be transported rapidly to the back contact electrode 20 or upper electrode 40 via fullerene molecules or fullerene derivative molecules. When fullerene molecules or fullerene derivative molecules are linked and an electron path is formed, electron transportability is enhanced and a high-speed response of the organic photoelectric conversion device may be realized. For that purpose, it is preferable that the photoelectric conversion layer 32 includes a fullerene or fullerene derivative not less than 40%. Too much amount of fullerene or fullerene derivative, however, may result in a reduced area of junction interface and deterioration of exciton dissociation efficiency due to a reduced amount of p-type organic semiconductor.

Use of the triarylamine compound described, for example, in Japanese Patent No. 4213832 as the p-type organic semiconductor mixed in the photoelectric conversion layer 32 with a fullerene or fullerene derivative is particularly preferable as it allows the organic photoelectric conversion device to exhibit a high S/N ratio. A too high ratio of fullerene or fullerene derivative in the photoelectric conversion layer 32 may result in a reduced absorption amount of incident light due to a reduced amount of the triarylamine compound. This will deteriorate the photoelectric conversion efficiency and it is preferable that the amount of fullerene or fullerene derivative included in the photoelectric conversion layer 32 is not greater than 85% of the total composition.

Further, as described above, the mixed layer of a p-type organic semiconductor and a fullerene or a fullerene derivative of the photoelectric conversion layer 32 is formed by deposition using a vapor deposition material for photoelectric conversion device formed of a plurality of particles consisting primarily of a fullerene or a fullerene derivative with an average particle size expressed as D50% of 50 to 300 μm. The film that includes a fullerene or fullerene derivative deposited using such a vapor deposition material is a film formed using a vapor deposition material of particles that includes the fullerene or fullerene derivative with particle sizes being made suitable. Consequently, as will be demonstrated in the Examples to be described later, the photoelectric conversion device 1 that includes such photoelectric conversion layer 32 has high photoelectric conversion efficiency with a favorable S/N ratio of photocurrent/dark current and a high response speed.

In order to fully exhibit advantageous effects of the present invention, it is preferable that the p-type organic semiconductor is a compound represented by a general formula (1) given below.

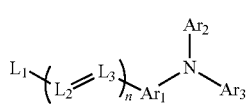

(1)

where, L2 and L3 each independently represents a non-substituted methine group or substituted methine group, "n" represents an integer of 0 to 2, Ar1 represents a substituted divalent arylene group or non-substituted arylene group, Ar2 and Ar3 each independently represents a substituted aryl group, non-substituted aryl group, substituted alkyl group, non-substituted alkyl group, substituted heteroaryl group, or non-substituted heteroaryl group. Those of the Ar1, Ar2, and Ar3 adjacent to each other may be interlinked to form a ring. L1 represents a non-substituted or substituted methine group that combines with a general formula (2) given below, or a group represented by a general formula (3) given below.

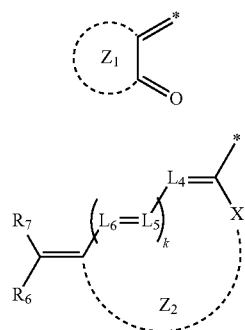

where, Z1 represents a ring containing a carbon atom that combines with L1 and a carbonyl group adjacent to the carbon atom, which is a condensed ring containing 5- and 6-membered rings or at lease either of them. The symbol "X" represents a heteroatom. Z2 represents a ring containing "X", which is a condensed ring containing 5-, 6-, and 7-membered rings or at least any of them. L4 to L6 each independently represents non-substituted methine group or substituted methine group. R6 and R7, each independently represents hydrogen atom or substituent and those adjacent to each other may be interlinked to form a ring. The symbol "k" represents an integer of 0 to 2. The symbol "*" in the general formula (2) indicates the binding position with L1. The symbol "*" in the general formula (3) indicates the binding position with L2 or Ar1.

Z1 in the general formula (2) represents a ring containing two carbon atoms, which is a condensed ring containing 5- and 6-membered rings or either of them. As for such rings, those of merocyanine dyes normally used as an acidic nucleus are preferable, and specific examples thereof include but not limited to the following:

(a) 1,3-dicarbonyl nuclei, such as 1,3-indandione nucleus, 1,3-cyclohexanedione, 5,5-dimethyl-1,3-cyclohexanedione, 1,3-dioxine-4,6-dione, and the like, (b) pyrazolinone nuclei, such as 1-phenyl-2-pyrazolin-5-one, 3-methyl-1-phenyl-2-pyrazolin-5-one, 1-(2-benzothiazolyl)-3-methyl-2-pyrazolin-5-one, and the like, (c) isoxazolinone nuclei, such as 3-phenyl-2-isoxazolin-5-one, 3-methyl-2-isoxazolin-5-one, and the like, (d) oxindole nucleus, such as 1-alkyl-2,3-dihydro-2-oxindole, and the like, (e) 2,4,6-triketohexahydropyrimidine nuclei, such as barbituric acid or 2-thiobarbituric acid and their derivatives which may include, for example, 1-alkyl bodies, such as 1-methyl, 1-ethyl, and the like, 1,3-dialkyl bodies, such as 1,3-dimethyl, 1,3-diethyl, 1,3-dibutyl, and the like, 1,3-diaryl bodies, such as 1,3-diphenyl, 1,3-di(p-chlorophenyl), 1,3-di(p-ethoxycarbonylphenyl), and the like, 1-alkyl-1-aryl bodies, such as 1-ethyl-3-phenyl, and the like, and 1,3 di-heterocycle substituted bodies, such as 1,3-di(2-pyridyl), and the like, (f) 2-thio-2,4-thiazolidinedione nuclei, such as rhodanine and derivatives which may include, for example, 3-alkyrhodanine, including 3-methylrhodanine, 3-ethylrhodanine, and 3-arylrhodanine, 3-arylrhodanine, including 3-phenylrhodanine, and 3-heterocycle substituted rhodanine, including 3-(2-pyridyl)rhodanine, (g) 2-thio-2,4-oxazolidinedione(2-thio-2,4-(3H,5H)-oxazoledione) nuclei, such as 3-ethyl-2-thio-2,4-oxazolidinedione, and the like, (h) thianaphthenone nuclei, such as 3(2H)-thianaphthenone-1,1-dioxide, (i) 2-thio-2,5-thiazolidinedione nuclei, such as 3-ethyl-2-thio-2,5-thiazolidinedione, (j) 2-4-thiazolidinedione nuclei, such as 2,4-thiazolidinedione, 3-ethyl-2,4-thiazolidinedione, 3-phenyl-2,4-thiazolidinedione, and the like, (k) thiazoline-4-one nuclei, such as 4-thiazolinone, 2-ethyl-4-thiazolinone, and the like, (l) 2,4-imidazolidinedione(hydantoin) nuclei, such as 2,4-imidazolidinedione, 3-ethyl-2,4-imidazolidinedione, and the like, (m) 2-thio-2,4-imidazolidinedione(2-thiohydantoin) nuclei, such as 2-thio-2,4-imidazolidinedione, 3-ethyl-2-thio-2,4-imidazolidinedione, and the like, (n) 2-imidazoline-5-one nuclei, such as 2-propylmercapto-2-imidazoline-5-one, and the like, (o) 3,5-pyrazolidinedione nuclei, such as 1,2-diphenyl-3,5-pyrazolidinedione, 1,2-dimethyl-3,5-pyrazolidinedione, and the like, (p) benzothiophene-3-one nuclei, such as benzothiophene-3-one, oxobenzothiophene-3-one, dioxobenzothiophene-3-one, and the like, and (q) indanone nuclei, such as 1-indanone, 3-phenyl-1-indanone, 3-methyl-1-indanone, 3,3 diphenyl-1-indanone, 3,3-dimethyl-1-indanone, and the like.

Preferable rings represented by Z1 include 1,3-dicarbonyl nuclei, pyrazolinone nuclei, 2,4,6-triketohexahydropyrimidine nuclei (including thioketone bodies and, for example, barbituric acid nucleus or 2-thiobarbituric acid nucleus), 2-thio-2,4-thiazolidinedione nuclei, 2-thio-2,4-oxazolidinedione nuclei, 2-thio-2,5-thiazolidinedione nuclei, [[2-]]2,4-thiazolidinedione nuclei, 2,4-imidazolidinedione nuclei, 2-thio-2,4-imidazolidinedione nuclei, 2-imidazoline-5-one nuclei, 3,5-pyrazolidinedione nuclei, benzothiophene-3-one nuclei, and indanone nuclei, more preferable rings include 1,3-dicarbonyl nuclei, 2,4,6-triketohexahydropyrimidine nuclei (including thioketone bodies and, for example, barbituric acid nucleus or 2-thiobarbituric acid nucleus), 3,5-pyrazolidinedione nuclei, benzothiophene-3-one nuclei, and indanone nuclei, further preferable rings include 1,3-dicarbonyl nuclei, 2,4,6-triketohexahydropyrimidine nuclei (including thioketone bodies and, for example, barbituric acid nucleus or 2-thiobarbituric acid nucleus), and particularly preferable rings include 1,3-indandione nucleus, barbituric acid nucleus, 2-thiobarbituric acid nucleus, and their derivatives. Preferable rings represented by Z1 may be represented by the formula (4) given below.

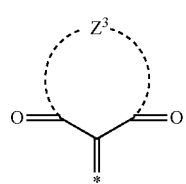

(4)

where, Z3 represents a ring containing a carbon atom that combines with L1 and two carbonyl groups adjacent to the carbon atom, which is a condensed ring containing 5- and 6-membered rings or at lease either of them. The symbol "*" indicates the binding position with L1. Z3 may be selected from the ring represented by Z1, in which 1,3-dicarbonyl nuclei and 2,4,6-triketohexahydropyrimidine nuclei (including thioketone bodies) are preferable, and 1,3-indandione nucleus, barbituric acid nucleus, 2-thiobarbituric acid nucleus, and their derivatives are particularly preferable.

If the ring represented by Z1 is 1,3-indandione, it is preferable to be a group represented by the general formula (5) given below.

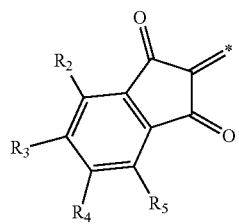

(5)

where, R2 to R5, each independently represents a hydrogen atom or a substituent, and those adjacent to each other may be interlinked to form a ring. The symbol "*" indicates the binding position with L1.

The symbol "k" in the general formula (3) represents an integer of 0 to 2 which is preferable to be 0 or 1, and more preferable to be 0. The "X" is preferable to be "O", "S", or N—R10. Preferable rings represented by Z2 may be represented by the formula (6) given below.

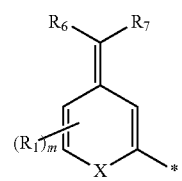

(6)

where, "X" represents "O", "S", or N—R10. R10 represents a hydrogen atom or a substituent. R1, R6, R7, each independently represents a hydrogen atom or a substituent and those adjacent to each other may interlinked to forma ring. The symbol "m" represents an integer of 1 to 3. When the symbol "m" is not less than 2, a plurality of R1 may be identical or different. The symbol "*" represents a binding position with L2 or Ar1.

As for the arylene group represented by Ar1, an arylene group with a carbon number of 6 to 30 is preferable and more preferably with a carbon number of 6 to 18. The arylene group may have a substituent and is an arylene group with a carbon number of 6 to 18 which may preferably have an alkyl group with a carbon number of 1 to 4, examples of which may include phenylene group, naphthylene group, methylphenylene group, dimethylphenylene group, and the like and among them phenylene group and naphthylene group are preferable.

As for the aryl group independently represented by Ar2 and Ar3, an aryl group with a carbon number of 6 to 30 is preferable and more preferably with a carbon number of 6 to 18. The aryl group may have a substituent and is an aryl group with a carbon number of 6 to 18 which preferably may have an aryl group with a carbon number of 1 to 4, examples of which may be phenylene group, naphthyl group, tolyl group, anthryl group, dimethylphenyl group, biphenyl group and the like and among them phenylene group and naphthyl group are preferable.

As for the alkyl group independently represented by Ar2 and Ar3, an alkyl group with a carbon number of 1 to 6 is preferable and an alkyl group with a carbon number of 1 to 4 is more preferable. Examples include, methyl group, ethyl group, n-propyl group, isopropyl group, and t-butyl group, in which methyl group and ethyl group are preferable and methyl group is more preferable.

As for the heteroaryl group independently represented by Ar2 and Ar3, a heteroaryl with a carbon number of 3 to 30 is preferable and more preferably with a carbon number of 3 to 18. The heteroaryl group may have a substituent and is a heteroaryl with a carbon number of 3 to 18 which preferably may have an alkyl group with a carbon number of 1 to 4 or an aryl group with a carbon number of 6 to 18. Further, the heteroaryl group represented by Ar2 or Ar3 may have a condensed ring structure which is preferable to be a combination of different (or identical) rings selected from the group consisting of furan ring, thiophene ring, selenophene ring, silole ring, pyridine ring, pyrazine ring, pyrimidine ring, oxazole ring, triazole ring, triazole ring, oxadiazole ring, thiadiazole ring, and preferable examples are quinoline ring, isoquinoline ring, benzothiophene ring, thienothiophene ring, bithienobenzene ring, and bithienothiophene ring.

Those of Ar1, Ar2, Ar3, R1, R2 to R7, and R10 adjacent to each other may be interlinked to form a ring. Preferably, the ring is formed of a heteroatom, alkyl group, and aromatic ring. An example may be a ring formed with a nitrogen atom (N in the general formula (1)) by single bonding of two of the aryl groups (e.g., Ar1, Ar2, and Ar3 in general formula (1)) or by linking thereof via a linking group. As for the linking group, a heteroatom (e.g., —O—, —S—, and the like), an alkyl group (e.g., methylene group, ethylene group, and the like), and a combination thereof are cited, in which —S— and methylene group are preferable. A ring formed of a nitrogen atom (N in the general formula (1)), an alkylene group (e.g., methylene group), and an aryl group (e.g., Ar1, Ar2, or Ar3 in general formula (1)) is preferable. Further, the ring may have a substituent. Such a substituent may be an alkyl group (preferably an alkyl group with a carbon number of 1 to 4 and more preferably a methyl group) and a plurality of substituents may be interlinked to further form a ring (e.g., a benzene ring or the like).

It is also preferable that R3 and R4 are interlinked to form a ring which is preferable to be a benzene ring.

Further, in the case where there is a plurality of R1s (m is 2 or greater), those of the plurality of R1s adjacent to each other may be interlinked to form a ring which is preferable to be a benzene ring.

In the case where Ar1, Ar2, and Ar3 have substituents, the substituents and substituent of R1, R2 to R7, and R10 may be a halogen atom, alkyl group (cycloalkyl group, bicycloalkyl group, tricycloalkyl group), substituted alkyl group, alkenyl group (cycloalkenyl group and bicycloalkenyl group), alkynyl group, aryl group, substituted aryl group, heterocyclic group, cyano group, hydroxy group, nitro group, carboxy group, alkoxy group, aryloxy group, silyloxy group, heterocyclic oxy group, acyloxy group, carbamoyloxy group, alkoxycarbonyl group, aryloxycarbonyl group, amino group (anilino group), ammonio group, acylamino group, aminocarbonylamino group, alkoxycarbonylamino group, aryloxycarbonylamino group, sulfamoylamino group, alkyl and arylsulfonylamino group, mercapto group, alkylthio group, arylthio group, heterocyclic thio group, sulfamoyl group, sulfo group, alkyl and arylsulfinyl group, alkyl and arylsulfonyl group, acyl group, aryloxycarbonyl group, alkoxycarbonyl group, carbamoyl group, aryl and heterocyclic azo group, imide group, phosphino group, phosphinyl group, phosphinyloxy group, phosphinylamino group, phosphono group, silyl group, hydrazine group, ureido group, boronic acid group (—B(OH)$_2$), phosphate group (—OPO(OH)$_2$), sulphate group (—OSO$_3$H), and other known substituents. As for the substituent of R1, R2 to R7, and R10, alkyl group, substituted alkyl group, aryl group, substituted aryl group, heteroaryl group, cyano group, nitro group, alkoxy group, aryloxy group, amino group, alkylthio group, alkenyl group, or a halogen atom are particularly preferable.

In the case where Ar1, Ar2, and Ar3 have substituents, each independently preferable to be a halogen atom, alkyl group, aryl group, heterocyclic group, hydroxy group, nitro group, alkoxy group, aryloxy group, heterocyclic oxy group, amino group, alkylthio group, arylthio group, alkenyl group, cyano group, or heterocyclic thio group. As for R1, alkyl group and aryl group is more preferable. As for R6 and R7, cyano group is more preferable.

As for the substituents of the substituted alkyl group or substituted aryl group, those listed above may be cited and alkyl group (preferably, alkyl group with a carbon number of 1 to 4 and more preferably methyl group) or aryl group (aryl group with a carbon number of 6 to 18 and more preferably phenyl group) are preferable.

In the case where L1, L2, L3, L4, L5, and L6 each independently represents a non-substituted methine group or a substituted methine group, the substituent of the substituted methine group represents an alkyl group, aryl group, heterocyclic group, alkenyl group, alkoxy group or aryloxy group and substituents themselves may be interlinked to form a ring. As for the ring, a 6-membered ring (e.g., benzene ring) may be cited. Further, substituents of L1 or L3 and Ar1 themselves may be interlinked to form a ring. Still further, substituents of L6 and R7 themselves may be interlinked to form a ring.

As for the alkyl group represented independently by each of R1, R2 to R7, and R10 is an alkyl group preferably with a carbon number of 1 to 6 and more preferably with a carbon number of 1 to 4, examples of which may be methyl group, ethyl group, n-propyl group, isopropyl group, n-butyl group, isobutyl group, and t-butyl group. As for R2 to R7, methyl group and ethyl group are preferable and methyl group is more preferable. As for R1, methyl group, ethyl group, and t-butyl group are preferable and methyl group or t-butyl group is more preferable. A preferable value of "n" is 0 or 1.

As for the aryl group represented independently by each of R1, R2 to R7, and R10 is an aryl group with a carbon number of 6 to 30 and more preferably with a carbon number of 6 to 18. The aryl group may have a substituent and is an aryl group with a carbon number of 6 to 18 which preferably may have an alkyl group with a carbon number of 1 to 4 or an aryl group with a carbon number of 6 to 18, examples of which may include phenyl group, naphthyl group, anthracenyl group, pyrenyl group, phenanthrenyl group, methylphenyl group, dimethylphenyl group, biphenyl group, and the like, in which phenyl group, naphthyl group, or anthracenyl group is preferable.

As for the heteroaryl group represented independently by each of R1, R2 to R7, and R10 is a heteroaryl group preferably with a carbon number of 3 to 30 and more preferably with a carbon number of 3 to 18. The heteroaryl group may have a substituent and is a heteroaryl group with a carbon number of 3 to 18 which preferably may have an alkyl group with a carbon number of 1 to 4 or an aryl group with a carbon number of 6 to 18. As for the heteroaryl group represented by each of R1 and R2 to R7, a heteroaryl of 5-, 6- or 7-membered ring or a condensed ring thereof. As for a hetero atom included in the heteroaryl group, an oxygen atom, sulfur atom, and nitrogen atom may be cited. Specific examples of rings constituting the heteroaryl group include furan ring, thiophene ring, pyrrole ring, pyrroline ring, oxazole ring, isoxazole ring, triazole ring, isothiazole ring, imidazole ring, imidazoline ring, imidazolidine ring, pyrazole ring, pyrazoline ring, pyrazolidine ring, triazole ring, furazan ring, tetrazole ring, pyran ring, chin ring, pyridine ring, piperidine ring, oxazine ring, morpholine ring, thiazine ring, pyridazine ring, pyrimidine ring, pyrazine ring, piperazine ring, triazine ring, and the like.

Example condensed rings include benzofuran ring, isobenzofuran ring, benzothiophen ring, indole ring, indoline ring, isoindole ring, benzoxazole ring, benzothiazole ring, indazole ring, benzoimidazole ring, quinoline ring, isoquinoline ring, cinnoline ring, phthalazine ring, quinazoline ring, quinoxaline ring, dibenzofuran ring, carbazole ring, xanthenes ring, acridine ring, phenanthridine ring, phenanthroline ring, phenazine ring, phenoxazine ring, thianthrene ring, thienothiophene ring, indolizine ring, quinolizine ring, quinuclidine ring, naphthyridine ring, purine ring, pteridine ring, and the like.

The symbol of "m" represents an integer of 1 to 3, and a value of 1 or 2 is preferable and a value of 1 is more preferable.
Among compounds represented by the general formula (1), the following compounds are particularly preferable.
COMPOUND 1
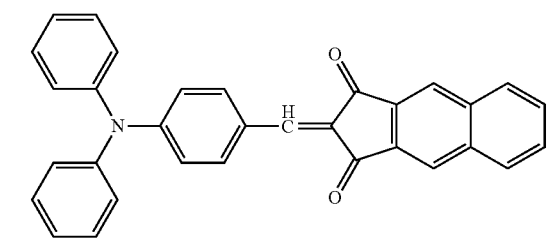
COMPOUND 2
COMPOUND 3
COMPOUND 4
COMPOUND 5
-continued
COMPOUND 6
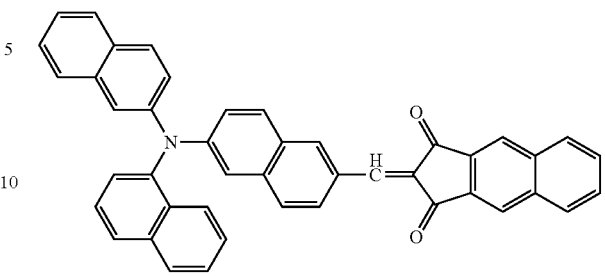
COMPOUND 7
COMPOUND 8
COMPOUND 9
COMPOUND 10

COMPOUND 11
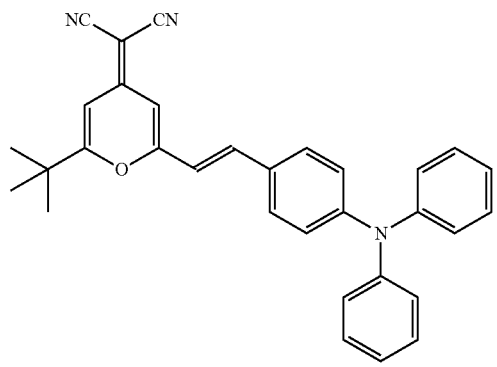
COMPOUND 12
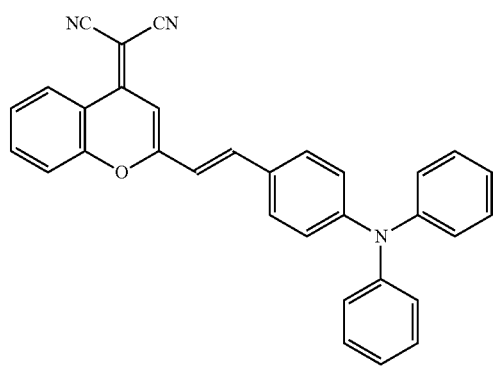
COMPOUND 13
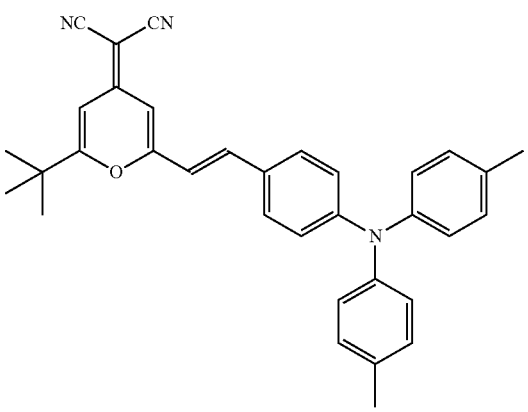
COMPOUND 14
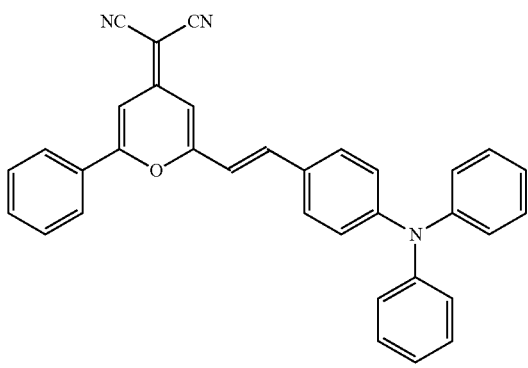
COMPOUND 15
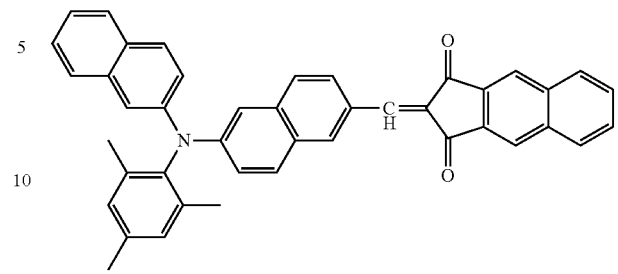
COMPOUND 16
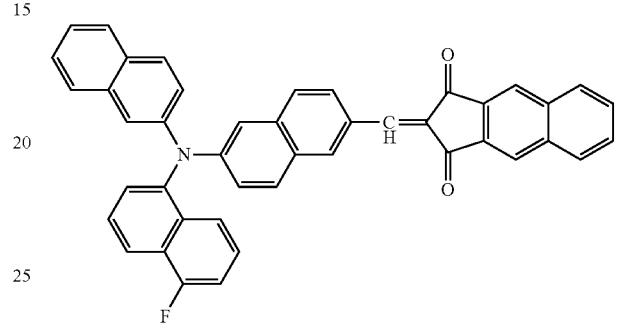
COMPOUND 17
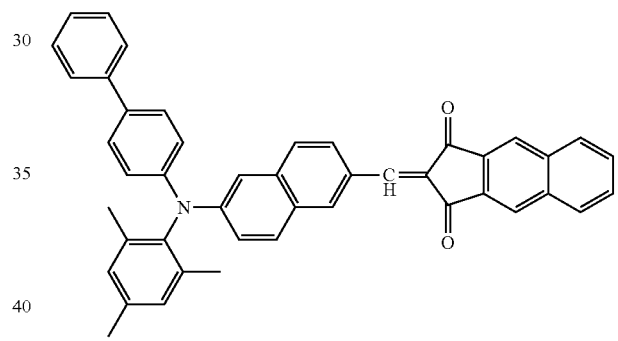
COMPOUND 18
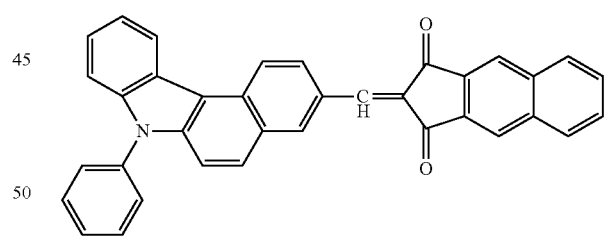
COMPOUND 19
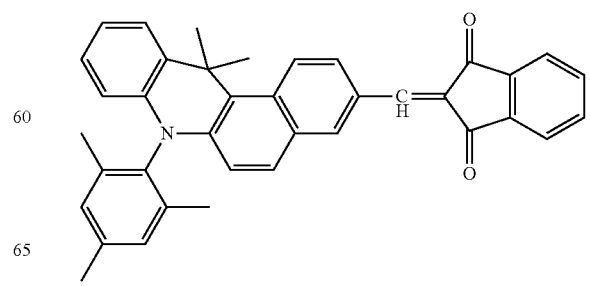

-continued

COMPOUND 20

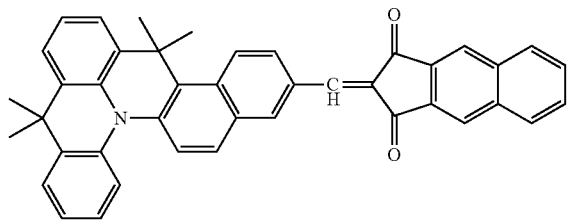

COMPOUND 21

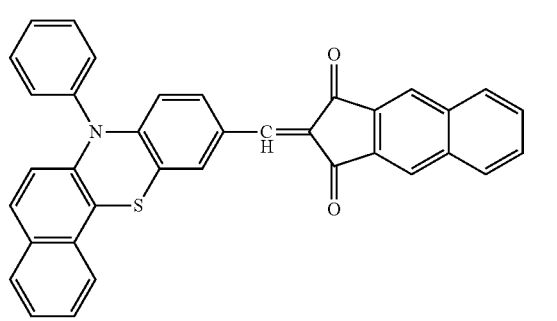

COMPOUND 22

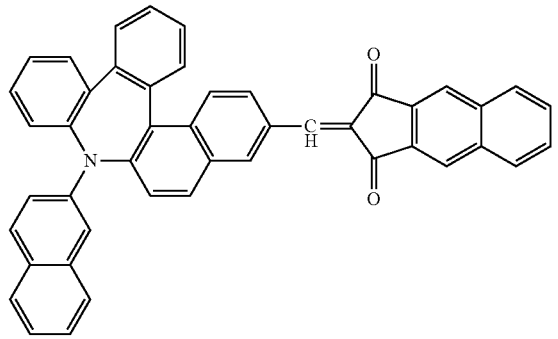

COMPOUND 23

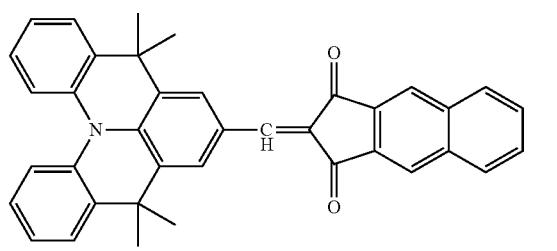

COMPOUND 24

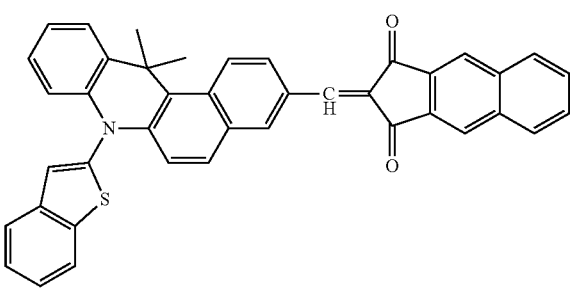

<<Electron Blocking Layer>>

The electron blocking layer 31 included in the light receiving layer 30 is a layer for preventing the injection of electrons into the photoelectric conversion layer 32 from the back contact electrode 20 and blocking electrons generated in the photoelectric conversion layer 32 from flowing into the electrode 20. The electron blocking layer 31 is formed by including an organic material, inorganic material, or both.

The electron blocking layer 31 may be formed of a plurality of layers. Such structure may provide an interface between each layer of the electron blocking layer 31 and causes discontinuity of intermediate level of each layer. As a result, charge blocking effects may be improved because charge movement via the intermediate level and the like becomes difficult. If each layer of the electron blocking layer 31 is made of the same material, however, there may be a case in which the intermediate level of each layer becomes exactly the same. Thus, in order to further enhance the electron blocking effects, it is preferable that each layer is formed of a different material.

Electron-donating organic materials may be used for the electron blocking layer 31. Specific low-molecular materials that can be used may include aromatic diamine compounds, such as N,N'-bis(3-methylphenyl)-(1,1'-biphenyl)-4,4'-diamine (TPD), 4,4'-bis [N-(naphthyl)-N-phenyl-amino]biphenyl (α-NPD), and the like, oxazole, oxadiazole, triazole, imidazole, and imidazolone, stilbene derivative, pyrazoline derivative, tetrahydroimidazole, polyarylalkane, butadiene; 4,4',4"-tris(N-(3-methylphenyl)-N-phenylamino) triphenylamine (m-MTDATA), porphyrine compounds, such as porphine, copper tetraphenylporphine, phthalocianine, copper phthalocyanine, and titanium phthalocyanine oxide, triazole derivative, oxadiazole derivative, imidazole derivative, polyarylalkane derivative, pyrazoline derivative, pyrazolone derivative, phenylenediamine derivative, arylamine derivative, fluorine derivative, amino-substituted chalcone derivative, oxazole derivative, styrylanthracene derivative; fluorenone derivative, hydrazone derivative, silazane derivative, and the like. High-molecular materials that can be used may include polymers of phenylenevinylene, fluorine, carbazole, indole, pyrene, pyrrole, picoline, thiophene, acetylene, diacetylene, and the like, and derivatives thereof. Even a compound which is not an electron-donating compound may be used as long as it has a sufficient hole transport capability.

More specifically, such compounds may include, but not limited to, the following described, for example, in Japanese Unexamined Patent Publication No. 2008-072090. In the following, symbols "Ea" and "Ip" represent an electron affinity and an ionization potential of each material respectively. Further, the "EB" in EB-1, 2, - - - is the abbreviation of "electron blocking".

EB-1

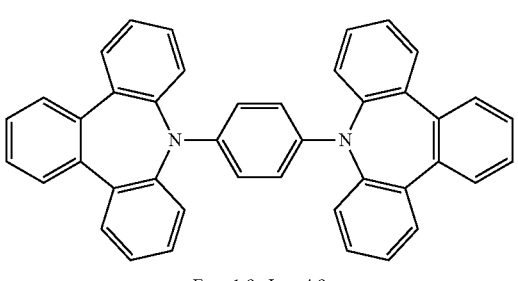

Ea = 1.9, Ip = 4.9

-continued

EB-2

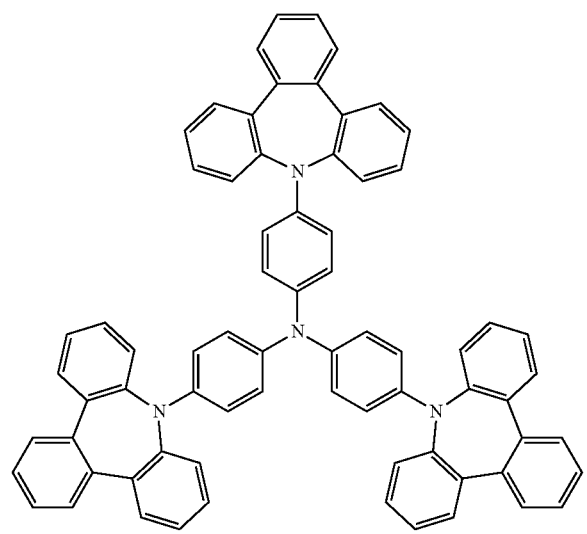

Ea = 1.7, Ip = 4.7

EB-3

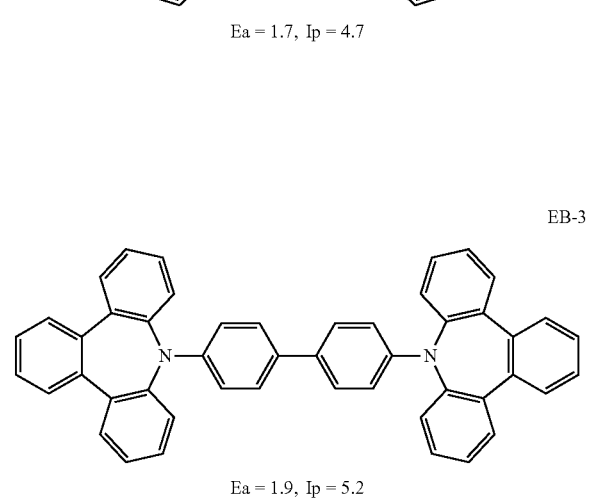

Ea = 1.9, Ip = 5.2

EB-4

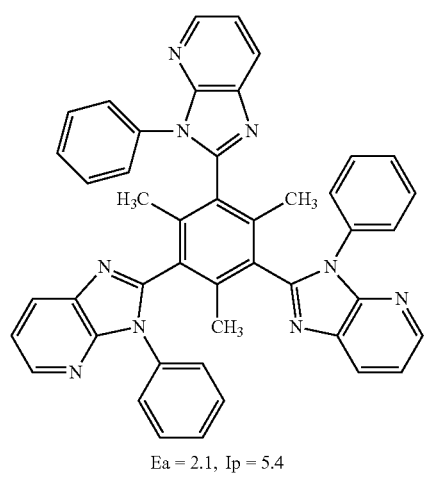

Ea = 2.1, Ip = 5.4

-continued

EB-5

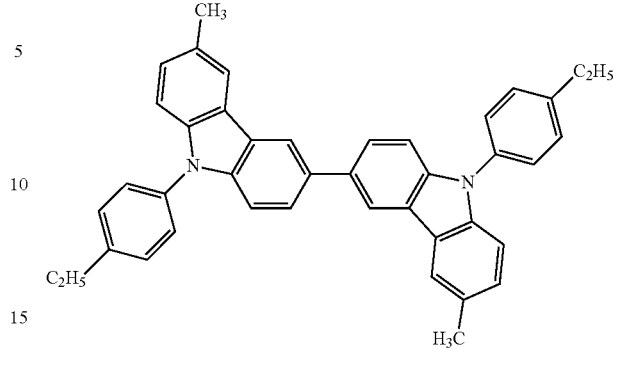

Ea = 2.1, Ip = 5.8 m-MTDATA

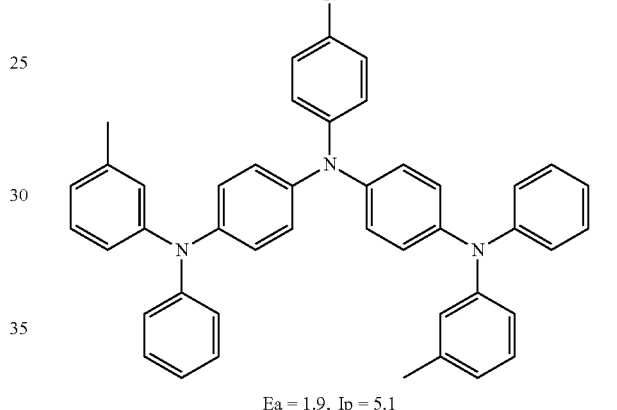

Ea = 1.9, Ip = 5.1

TPD

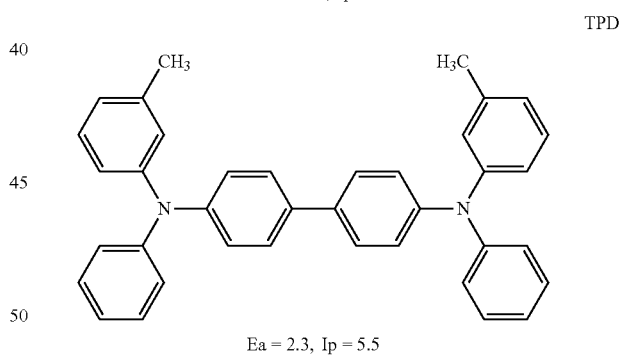

Ea = 2.3, Ip = 5.5

Inorganic materials may be used for the electron blocking layer 31. Use of an inorganic material for the electron blocking layer 31 causes a more voltage to be applied to the photoelectric conversion layer 32, thereby improving the photoelectric conversion efficiency, since inorganic materials, in general, have a larger dielectric constant than organic materials. Materials that can be used for the electron blocking layer 31 include calcium oxides, chromium oxides, copper chromium oxides, manganese oxides, cobalt oxides, nickel oxides, copper oxides, copper gallium oxides, copper strontium oxides, niobium oxides, molybdenum oxides, copper indium oxides, silver indium oxides, iridium oxides, and the like.

Preferably, in the electron blocking layer 31 formed of a plurality of layers, the layer adjacent to the photoelectric conversion layer 32 is a layer formed of a material identical to the p-type organic semiconductor included in the photoelectric conversion layer 32. Use of the same p-type organic material in the electron blocking layer 31 may prevent formation of an intermediate level at the interface of the layer adjacent to the photoelectric conversion layer 32, whereby the dark current may further be prevented.

In the case where the electron blocking layer 31 has a single layer structure, the layer may be formed of an inorganic material, while in the case where the electron blocking layer 31 has a multi-layer structure, one or more than one layer may be formed of an inorganic material.

In the case where a configuration in which a bias voltage is applied such that electrons are collected by the back contact electrode 20 while holes are collected by the upper electrode 40 is adopted, a hole blocking layer may be provided instead of the electron blocking layer 31. The hole blocking layer may be an organic layer for preventing the injection of holes into the photoelectric conversion layer 32 from the back contact electrode 20 and blocking holes generated in the photoelectric conversion layer 32 from flowing into the electrode 20. In this case also, by making the hole blocking layer as a layer having a multi-layer structure, hole blocking effects may be enhanced.

Further, electrons or holes collected by the upper electrode 40 may be converted to a voltage signal according to an amount thereof and taken out to the outside. In this case, an electron blocking layer or a hole blocking layer may be provided between the upper electrode 40 and photoelectric conversion layer 32. In either case, the portion sandwiched by the back contact electrode 20 and upper electrode 40 acts as the light receiving layer 30.

Electron-accepting organic materials may be used for the hole blocking layer. Electron-accepting materials that can be used may include oxadiazol derivatives, such as 1,3-bis(4-tert-buthylphenyl-1,3,4-oxadiazolyl) phenylene (OXD-7) and the like, anthraquinodimethane derivatives, diphenylquinone derivatives, bathocuproine and bathophenanthroline, and derivatives thereof, triazole compounds, tris(8-hydroxyquinolinate) aluminum complexes, bis(4-methyl-8-quinolinate) aluminum complexes, distyrylarylene derivatives, silole compounds, and the like. Even a material which is not an electron accepting organic material may be used as long as it has a sufficient electron transport capability. Porphyrin compounds, styryl system compounds, such as DCM(4-dicyanomethylene-2-methyl-6-(4-(dimethylaminostyryl))-4Hpyran), and the like, and 4Hpyran compounds may be used.

<Sealing Layer>

The sealing layer 50 is a layer for preventing factors that deteriorate an organic material such as water, oxygen, and the like, from intruding into the light receiving layer that includes the organic material. The sealing layer 50 is formed to cover the back contact electrode 20, electron blocking layer 31, photoelectric conversion layer 32, and upper electrode 40.

In the photoelectric conversion device 1, incident light reaches the photoelectric conversion layer 32 through the sealing layer 50. It is necessary, therefore, that the sealing layer 50 is sufficiently transparent to light having a wavelength that can be sensed by the photoelectric conversion layer 32. Such a sealing layer 50 may be formed of water molecule resistant ceramics of dense metal oxides, metal nitrides, or metal nitride oxides, diamond-like carbons (DLCs), and the like, and aluminum oxides, silicon oxides, silicon nitrides, silicon nitride oxides, layered films of these, or layered films of these and organic polymers have conventionally been used.

The sealing layer 50 may be formed of a thin film of a single material, but advantageous effects, such as strain release, prevention of defects, such as cracks, pinholes, and the like due to dust raised during manufacturing, ease of optimization in material development, and the like may be expected by forming the sealing layer 50 in a multi-layer structure and allocating a different function to each layer. For example, the sealing layer 50 may be formed in a two-layer structure in which an "auxiliary sealing layer" may be stacked on an original sealing layer that accomplishes the intended purpose of preventing deterioration factors, such as water molecules, from intruding so that a function which is difficult to be performed by the original sealing layer is performed by the auxiliary sealing layer. A three-layer structure is possible, but as less a number of layers as possible is preferable in view of manufacturing cost.

There is not any specific restriction on the method of forming the sealing layer 50 but it is preferable that the sealing layer 50 is formed by a method that does not deteriorate, as much as possible, the performance and film quality of the photoelectric conversion layer 32 and the like. It has been a common practice to perform film forming by various types of vacuum film forming techniques, but conventional sealing layers have a disadvantage that the film thickness at a step portion formed by a structure on the substrate, a small defect on the substrate, or a particle adhered to the surface of the substrate becomes significantly thinner in comparison with that of a flat portion due to difficulty (shadowed by the step) in film growth. Consequently, the step portion becomes an intrusion path of a deterioration factor. In order to completely cover the step portion with a sealing layer, the entire sealing layer must be formed thick with a film thickness of not less than 1 μm at the flat portion. Preferably, the degree of vacuum at the time of forming the sealing layer is not greater than $1 \times 10^3$ Pa, and more preferably not greater than $5 \times 10^2$ Pa.

Considering an imaging device with a pixel size of less than 2 μm, in particular, about 1 μm, however, a large film thickness of the sealing layer 50 results in a large distance between the color filters and photoelectric conversion layer, thereby causing diffraction/diffusion of incident light in the sealing layer and color mixture may occur. Thus, in view of application to an imaging device with a pixel size of about 1 μm, it is necessary to provide a sealing layer material and manufacturing method that do not deteriorate the device performance even when the film thickness of the sealing layer 50 is reduced.

The atomic layer deposition (ALD) method is one of the CVD methods and a technique for forming a thin film by alternately repeating adsorption/reaction of organometallic compound molecules, metal halide molecules, or metal hydride molecules of the material of the thin film on the surface of a substrate and decomposition of unreacted groups included therein. When the thin film material reaches the surface of the substrate, the material is in a low molecular state and thin film growth is possible if there is a tiny space into which the low molecules may infiltrate. Consequently, the step portion may be covered completely (thickness of the film grown at the step portion is identical to that of the film grown at a flat portion), which has not been possible by conventional thin film forming methods, that is, the atomic layer deposition method is very excellent in step coverage. Thus, steps formed by a structure on the substrate, a small defect on the substrate, and a particle adhered to the surface of the substrate surface may be covered completely so that such step portions do not become intrusion paths of deterioration factors. In the case where the sealing layer 50 is formed by the atomic layer deposition method, the film thickness required of the sealing layer may be reduced in comparison with conventional methods.

In the case where the sealing layer 50 is formed by the atomic layer deposition method, a material corresponding to one of the ceramics preferable for the sealing layer 50 described above may be selected as appropriate. As an organic photoelectric conversion material is used for the photoelectric conversion layer of the present invention, however, the material is limited to those that allow thin film forming at a relatively low temperature that does not deteriorate the organic photoelectric conversion material. The atomic layer deposition method using alkylaluminium or aluminum halide may form a dense aluminum oxide thin film at a temperature of less than 200° C. that does not deteriorate the organic photoelectric conversion material. Use of trimethylaluminium, in particular, is preferable as it allows formation of an aluminum oxide thin film at a temperature around 100° C. An appropriately selected silicon oxide or titanium oxide is also preferable as it allows formation of a dense thin film at a temperature of less than 200° C., as in the aluminum oxide.

The atomic layer deposition method may form an incomparably excellent thin film from the viewpoint of step coverage and density at a low temperature. There may be a case, however, that the physical property of the thin film material is deteriorated by a chemical used in photolithography. For example, the aluminum oxide thin film formed by the atomic layer deposition method is an amorphous film and the surface may be eroded by alkali solutions such as developing or stripping solutions.

Further, thin films formed by CVD methods, such as the atomic layer deposition method, in general, have a large internal tensile stress and a crack may be formed in the film when subjected to a process in which intermittent heating and cooling are repeated, such as a semiconductor manufacturing process, or prolonged storage/use under an environment of high temperature/high humidity.

As such, in the case where a sealing layer 50 formed by the atomic layer deposition method is used, it is preferable that an auxiliary sealing layer excellent in chemical resistance and capable of cancelling the internal stress is additionally formed.

As for such auxiliary sealing layer, for example, a layer that includes any one of ceramics of metal oxide, metal nitride, and metal nitride oxide formed by a physical vapor deposition (PVD) method, such as sputtering, and is excellent in chemical resistance may be cited. Generally, ceramics formed by PVD method, such as sputtering, have a large compressive stress and may cancel the tensile strength of the sealing layer 50 formed by the atomic layer deposition method.

Preferably, the sealing layer 50 formed by the atomic layer deposition method includes any one of aluminum oxide, silicon oxide, and titanium oxide, while the auxiliary sealing layer is a sputtered film that includes any one of aluminum oxide, silicon oxide, silicon nitride, and silicon nitride oxide. Preferably, in this case, the film thickness of the sealing layer 50 is not less than 0.05 μm and not greater than 0.5 μm.

The photoelectric conversion device 1 is formed in the manner described above.

[Imaging Device]

A structure of an imaging device 100 provided with the photoelectric conversion device 1 will now be described with reference to FIG. 6. FIG. 6 is a schematic cross-section view of an imaging device according to an embodiment of the present invention, schematically illustrating the structure thereof. The imaging device shown in FIG. 6 is used by mounting in image pickup apparatuses, including digital cameras, digital video cameras, and the like, electronic endoscope apparatuses, and image pickup modules, such as mobile phones and the like.

The imaging device 100 includes a plurality of organic photoelectric conversion devices 1, each being structured as illustrated in FIG. 1, and a circuit substrate in which a readout circuit for reading out a signal according to an amount of charges generated in the photoelectric conversion layer of each photoelectric conversion device. The imaging device 100 has a structure in which the plurality of photoelectric conversion devices 1 is disposed one- or two-dimensionally on the same plane above the circuit substrate.

The imaging device 100 includes a substrate 101, an insulating layer 102, connection electrodes 103, pixel electrodes 104, connection sections 105, connection sections 106, a light receiving layer 107, an opposite electrode 108, a buffer layer 109, a sealing layer 110, color filters (CF) 111, partition walls 112, light blocking layer 113, a protection layer 114, opposite electrode voltage supply sections 115, and readout circuits 116.

The pixel electrode 104 has a function identical to that of the back contact electrode 20 of the organic photoelectric conversion device 1 illustrated in FIG. 1. The opposite electrode 108 has a function identical to that of the upper electrode 40 of the organic photoelectric conversion device 1 illustrated in FIG. 1. The light receiving layer 107 has a structure identical to that of the light receiving layer 30 provided between the back contact electrode 20 and upper electrode of the organic photoelectric conversion device 1 illustrated in FIG. 1. The sealing layer 110 has a function identical to that of the sealing layer 50 of the organic photoelectric conversion device 1 illustrated in FIG. 1. Each organic photoelectric conversion device is formed by each pixel electrode 104, a portion of the opposite electrode 108 opposing thereto, a portion of the light receiving layer 107 sandwiched between these electrodes, and portions of buffer layer 109 and sealing layer 110 opposing to each pixel electrode 104.

The substrate 101 is a glass substrate or a semiconductor substrate, such as Si or the like. The insulating layer 102 is formed on the substrate 101. A plurality of pixel electrode 104 and a plurality of connection electrodes are formed on the surface of the insulating layer 102.

The light receiving layer 107 is a layer common to all of the organic photoelectric conversion devices provided on the plurality of pixel electrodes 104 so as to cover them.

The opposite electrode 108 is one electrode, provided on the light receiving layer 107, common to all of the organic photoelectric conversion devices. The opposite electrode 108 is extended to places on the connection electrodes 103 disposed outer side of the light receiving layer 107 and electrically connected to the connection electrodes 103.

Each connection section 106 is a plug or the like embedded in the insulating layer 102 to electrically connect each connection electrode 103 with each corresponding opposite electrode voltage supply section 115. Each opposite electrode voltage supply section 115 is formed in the substrate 101 and supplies a predetermined voltage to the opposite electrode 108 via the connection section 106 and connection electrode 103. If the voltage to be applied to the opposite electrode 108 is higher than the voltage of the power supply of the imaging device, the voltage of the power supply is boosted by a boosting circuit, such as a charge pump circuit or the like to the predetermined voltage and supplied.

Each readout circuit 116 is provided in the substrate 101 with respect to each of a plurality of pixel electrodes 104 to read out a signal according to an amount of charges collected by the corresponding pixel electrode 104. For example, each readout circuit 116 is formed of a CCD, MOS circuit, or TFT circuit and blocked from light by a light blocking layer (not shown) disposed in the insulating layer 102. Each readout circuit 116 is electrically connected to a corresponding pixel electrode 104 via a corresponding connection section 105.

The buffer layer 109 is formed on the opposite electrode 108 so as to cover the opposite electrode 108. The sealing layer 110 is formed on the buffer layer 109 so as to cover the buffer layer 109. Each color filter 111 is formed on a position of the sealing layer 110 corresponding to each pixel electrode 104. Each partition wall 112 is formed between color filters 111 to improve light transmission efficiency.

The light blocking layer 113 is formed on an area of the sealing layer 110 other than the areas on which the color filters 111 and partition walls 112 are provided to prevent light from reaching an area of light receiving layer 107 other than the effective pixel areas. The protection layer 114 is formed on the color filters 111, partition walls 112, and light blocking layer 113 to protect the entire imaging device 100.

In the imaging device 100 structured in the manner described above, when light is incident thereon, the light reaches the light receiving layer 107 and charges are generated in the layer. Holes of the generated charges are collected by the pixel electrodes 104 and voltage signals corresponding to the amounts thereof are read out to the outside of the imaging device 100 by the readout circuits 116.

The imaging device 100 is produced in the following manner.

The connection sections 105, 106, a plurality of connection electrodes 103, a plurality of pixel electrodes 104, and the insulating layer 102 are formed on a circuit substrate in which opposite electrode voltage supply sections 115 and readout circuits 116 are formed. For example, the plurality of pixel electrodes 104 is arranged in a square grid pattern on the insulating layer 102.

Next, the light receiving layer 107, opposite electrode 108, buffer layer 109, and sealing layer 110 are formed sequentially on the plurality of pixel electrodes 104. The methods of forming the light receiving layer 107, opposite electrode 108, and sealing layer 110 are identical to those described in the photoelectric conversion device 1. The buffer layer 109 may be formed, for example, by the resistance heating vacuum deposition method. Then, color filters 111, partition walls 112, and light blocking layer 113 are formed followed by the protection layer 114 to complete the formation of the imaging device 100.

EXAMPLES

Examples of the present invention will now be described.

Examples 1 to 4, Comparative Examples 1 to 5

A glass substrate was provided as the substrate, then an amorphous ITO back contact electrode (thickness of 30 nm) was formed on the substrate by sputtering, and the EB-3 described above was formed, as the electron blocking layer, by the resistance heating vacuum deposition method (thickness of 100 nm).

Fullerene ($C_{60}$) particles having average particle size and a HPLC purity shown in Table 1 (each metal impurity of less than 10 ppm) and the compound 7 described above were provided as the vapor deposition source and a photoelectric conversion layer was formed by co-deposition with a thickness of 500 nm (Examples 1 to 4, Comparative Examples 1 to 5). The co-deposition was performed by the resistance heating vacuum, deposition. The vacuum deposition of the electron blocking layer and photoelectric conversion layer were performed with a degree of vacuum of not greater than $4 \times 10^{-4}$ Pa.

In performing the deposition, a crystal oscillator was placed inside of the deposition system to measure the deposition rate of only the fullerene. The crystal oscillator was placed at a position such that the distance between the crystal oscillator and vapor deposition source is nearly equal to the distance between the vapor deposition source and substrate. The volume ratio between the fullerene $C_{60}$ and compound 7 in the formed photoelectric conversion layer was 3:1 (in terms of film thickness).

Next, an amorphous ITO upper electrode (thickness of 10 nm) was formed on the photoelectric conversion layer by sputtering to obtain a photoelectric conversion device of the present invention. A SiO film was formed on the upper electrode as the sealing layer by heating deposition and an $Al_2O_3$ layer was further formed by ALCVD method.

Then, each example imaging device was produced in a manner identical to that described above except that a CMOS substrate having a CMOS readout circuit and a connection electrode connected to the circuit was used. A DC output image and a dark-time output image were obtained when an external electric field was applied to the imaging device while light was directed thereto from a DC light source to evaluate white and black spots.

(Evaluation)

With respect to each of the photoelectric conversion devices and imaging devices of Examples 1 to 4 and Comparative Examples 1 to 5, the response speed was measured when an electric field of $2 \times 10^5$ V/cm was applied. The term "response speed" as used herein refers to a rise time of signal strength from 0% to 99%. Examples 1 to 4 showed favorable response characteristics with substantially the same response speed while Comparative Examples 1 to 5 showed reductions in the response speeds. The results are shown in Table 1. Table 1 also shows average particle sizes of the fullerene particles, fullerene deposition rates and their fluctuation ranges, and HPLC purities of the fullerene particles (vapor deposition material). The response speeds are indicated by relative values when the response speed of Examples 1 to 4 is taken as 100.

From Examples 1 to 4 and Comparative Examples 1 to 3 shown in Table 1, it is known that there is not a significant difference in fluctuation range of deposition rate between Examples and Comparative Examples, that is, they are almost the same in the stability of deposition rate. In the mean time, The response speeds of Examples 1 to 4 in which the average particle sizes of the fullerene particles are in the range from 50 μm to 300 μm are faster than others.

It is known from Example 2 and Comparative Examples 4 and 5 that an HPLC purity of not less than 99.5% is an important factor for increasing the response speed. As shown in Table 1, the effectiveness of the present invention is verified.

With respect to the imaging devices, the image quality was evaluated. Each of imaging devices of Examples 1 to 4 and Comparative Examples 1 to 4 showed a favorable image quality from a practical viewpoint without virtually any white or black spot.

TABLE 1

| | C60 AVERAGE PARTICLE SIZE (μm) | C60 DEPOSITION RATE (Å/s) | DEPOSITION RATE FLUCTUATION RANGE (Å/s) | C60 HPLC PURITY (%) | RISE TIME OF SIGNAL STRENGTH FROM 0 TO 99% (RELATIVE VALUE) |
|---|---|---|---|---|---|
| EXAMPLE1 | 50 | 9.5~10.9 | 1.4 | 99.9 | 100 |
| EXAMPLE2 | 132 | 10.5~12.0 | 1.5 | 99.5 | 100 |
| EXAMPLE3 | 180 | 0.2~0.84 | 0.64 | 99.9 | 100 |
| EXAMPLE4 | 296 | 9.0~10.7 | 1.7 | 99.9 | 100 |
| COMPARATIVE EXAMPLE1 | 31 | 8.5~10.1 | 1.6 | 99.9 | 95 |
| COMPARATIVE EXAMPLE2 | 28 | 0.5~1.28 | 0.78 | 99.9 | 92 |
| COMPARATIVE EXAMPLE3 | 453 | 10.0~11.8 | 1.8 | 99.9 | 90 |
| COMPARATIVE EXAMPLE4 | 130 | 10.5~12.0 | 1.5 | 99.3 | 93 |
| COMPARATIVE EXAMPLE5 | 131 | 10.3~12.0 | 1.7 | 99.0 | 91 |

Examples 5 to 7, Comparative Examples 6 to 7

Photoelectric conversion devices, each having a sealing layer and imaging devices of Examples 5 to 7 and Comparative Examples 6 to 7 were produced in a manner identical to that of Example 1 except that the compound 10, instead of the compound 7, and fullerene particles shown in Table 2 were used. The response speeds are indicated by relative values when the response speed of Examples 5 to 7 is taken as 100. As indicated in Table 2, also in the case of compound 10, the effectiveness of the present invention is verified.

Further, with respect to the imaging devices, the image quality evaluation was also performed. The evaluation showed that each of imaging devices of Examples 5 to 7 and Comparative Examples 6 to 7 has a favorable image quality from a practical viewpoint without virtually any white or black spot.

TABLE 2

| | C60 AVERAGE PARTICLE SIZE (μm) | C60 DEPOSITION RATE (Å/s) | DEPOSITION RATE FLUCTUATION RANGE (Å/s) | C60 HPLC PURITY (%) | RISE TIME OF SIGNAL STRENGTH FROM 0 TO 99% (RELATIVE VALUE) |
|---|---|---|---|---|---|
| EXAMPLE5 | 53 | 7.5~9.0 | 1.5 | 99.9 | 100 |
| EXAMPLE6 | 107 | 7.2~8.5 | 1.3 | 99.9 | 100 |
| EXAMPLE7 | 300 | 7.4~9.0 | 1.6 | 99.9 | 100 |
| COMPARATIVE EXAMPLE6 | 31 | 7.0~8.5 | 1.5 | 99.9 | 95 |
| COMPARATIVE EXAMPLE7 | 500 | 7.9~9.7 | 1.8 | 99.9 | 92 |

Example 8

A photoelectric conversion device having a sealing layer was produced in a manner identical to that of Example 1 except that a vapor deposition source formed by adding not less than 100 ppm of metal impurities (Fe: 250 ppm, Ni, Cr: 100 ppm each) to the fullerene vapor deposition material of Example 1 was used. As a result, a response speed almost identical to that of the photoelectric conversion device and imaging device of Example 1 was obtained. In the image evaluation, however, a plurality of defects, including white and black spots and the like, was observed in an image obtained by the imaging device.

What is claimed is:

1. A vapor deposition material used for depositing a light receiving layer of an organic photoelectric conversion device, the material comprising a plurality of particles or a compact formed of the particles consisting primarily of a fullerene or a fullerene derivative,
    wherein the plurality of particles has an average particle size expressed as D50% of 50 to 300 μm and a HPLC purity of not less than 99.5%, and
    the average particle size expressed as D50% defines the particle size at which a larger particle size group and a smaller particle size group become an equal amount upon the division of a plurality of particles into said larger particle size group and said smaller particle size group.

2. The vapor deposition material of claim 1 wherein a content of each metal element in the particles is less than 100 ppm.

3. The vapor deposition material of claim 1, wherein the particles consist primarily of a fullerene.

4. The vapor deposition material of claim 3, wherein the particles consist primarily of a fullerene C60.

5. An organic photoelectric conversion device having a pair of electrodes and a light receiving layer sandwiched between the pair of electrodes and including at least a photoelectric conversion layer,
    wherein at least a part of the light receiving layer includes a fullerene or a fullerene derivative deposited using the vapor deposition material of claim 1.

6. The photoelectric conversion device of claim 5, the layer that includes a fullerene or a fullerene derivative is a layer deposited by a resistance heating vacuum deposition method.

7. The photoelectric conversion device of claim 5, wherein the layer that includes a fullerene or a fullerene derivative is a layer deposited by co-deposition.

8. An imaging device, comprising:
the photoelectric conversion device of claim 5, the device being provided in plurality; and
a circuit substrate having a signal readout circuit formed therein for reading out a signal according to an amount of charges generated in the photoelectric conversion layer of each photoelectric conversion device.

9. A sensor comprising the photoelectric conversion device of claim 5.

10. A method of manufacturing an organic photoelectric conversion device having a pair of electrodes and a light receiving layer sandwiched between the pair of electrodes and including at least a photoelectric conversion layer, the method comprising the step of forming at least a part of the light receiving layer by a deposition method using the vapor deposition material of claim 1.

11. The method of claim 10, wherein the deposition method is a resistance heating vacuum deposition method.

12. The method of claim 11, wherein a film forming speed of the deposition method is in the range from 0.2 to 12 Å/s.

13. The method of claim 10, wherein the deposition method is a co-deposition method.

* * * * *